(12) United States Patent
Iida

(10) Patent No.: US 7,993,081 B2
(45) Date of Patent: Aug. 9, 2011

(54) SUBSTRATE CARRYING DEVICE, SUBSTRATE CARRYING METHOD AND COMPUTER-READABLE STORAGE MEDIUM

(75) Inventor: Naruaki Iida, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1172 days.

(21) Appl. No.: 11/616,484

(22) Filed: Dec. 27, 2006

(65) Prior Publication Data

US 2007/0160454 A1  Jul. 12, 2007

(30) Foreign Application Priority Data

Jan. 6, 2006  (JP) ................................ 2006-001865

(51) Int. Cl.
    *B65G 53/00*  (2006.01)
(52) U.S. Cl. ......................................... 406/88; 414/676
(58) Field of Classification Search ................... 406/88; 414/676

See application file for complete search history.

(56) References Cited

U.S. PATENT DOCUMENTS

| | | | |
|---|---|---|---|
| 4,081,201 A | | 3/1978 | Hassan et al. |
| 4,352,607 A | * | 10/1982 | Loveless et al. ................ 406/88 |
| 4,493,548 A | * | 1/1985 | Ateya ............................ 399/400 |
| 4,616,960 A | * | 10/1986 | Gladish ......................... 406/88 |
| 4,730,955 A | * | 3/1988 | Lenhart ......................... 406/88 |
| RE32,684 E | * | 5/1988 | Lenhart ......................... 406/84 |
| 4,978,253 A | * | 12/1990 | Lazzari ......................... 406/88 |
| 5,108,513 A | * | 4/1992 | Muller et al. ................... 134/15 |
| 5,497,987 A | * | 3/1996 | Henn et al. .................... 271/204 |
| 5,634,636 A | * | 6/1997 | Jackson et al. ................ 271/225 |
| 5,820,306 A | * | 10/1998 | Hilbish et al. ................. 406/88 |
| 5,951,006 A | * | 9/1999 | Biegelsen et al. ............ 271/195 |
| 5,984,591 A | * | 11/1999 | Hilbish et al. ................. 406/88 |
| 6,042,307 A | * | 3/2000 | Lenhart ......................... 406/88 |
| 6,361,041 B2 | * | 3/2002 | Stephan ....................... 271/195 |
| 6,447,217 B1 | * | 9/2002 | Toda et al. .................... 406/88 |
| 6,491,435 B1 | * | 12/2002 | Nishikawa et al. ............ 384/12 |
| 6,494,646 B1 | * | 12/2002 | Sala ............................. 406/88 |
| 6,585,259 B2 | * | 7/2003 | Kerpe et al. .................. 271/195 |
| 6,676,365 B2 | * | 1/2004 | Adam et al. ................... 406/83 |

(Continued)

FOREIGN PATENT DOCUMENTS

JP   57-128940   8/1982

(Continued)

OTHER PUBLICATIONS

Korean Office Action issued on Jan. 10, 2011 in corresponding Korean Application No. 10-2007-0001318 (with an English translation).

*Primary Examiner* — Joe Dillon, Jr.

(74) *Attorney, Agent, or Firm* — Oblon, Spivak, McClelland, Maier & Neustadt, L.L.P.

(57) ABSTRACT

A device capable of causing a substrate to float by a gas can suppress the consumption of a gas. The device includes a carrying passage along which a substrate is carried. The gas spouted through the gas spouting pores causes the substrate to float and creates gas flows in the carrying gas flow grooves to propel the substrate in a carrying direction. The carrying passage is divided with respect to the carrying direction into passage sections, and the spouting of the gas through groups of the gas spouting pores assigned respectively to the passage sections is controlled to suporess the consumption of the gas.

3 Claims, 19 Drawing Sheets

U.S. PATENT DOCUMENTS

| | | | |
|---|---|---|---|
| 7,165,918 B2 * | 1/2007 | Kruse | 406/93 |
| 7,269,475 B1 * | 9/2007 | Hogg et al. | 700/229 |
| 7,326,025 B2 * | 2/2008 | Viluan et al. | 414/676 |

FOREIGN PATENT DOCUMENTS

| | | |
|---|---|---|
| JP | 58-147246 | 10/1983 |
| JP | 1-278038 | 11/1989 |
| JP | 5-104344 | 4/1993 |
| JP | 7-228342 | 8/1995 |
| JP | 9-132321 | 5/1997 |
| JP | 2004-262608 | 9/2004 |
| JP | 2004-345814 | 12/2004 |

* cited by examiner

SUBSTRATE CARRYING DEVICE, SUBSTRATE CARRYING METHOD AND COMPUTER-READABLE STORAGE MEDIUM

BACKGROUND OF THE INVENTION

1. Field of the Invention

The present invention relates to a substrate carrying device that floats a substrate by the agency of a gas, such as air, and carries the floating substrate, a substrate carrying method, and a computer-readable storage medium storing programs for accomplishing the substrate carrying method.

2. Description of the Related Art

A carrying arm is most prevalently used as a substrate carrying mechanism in a semiconductor device fabricating process. The carrying arm needs a mechanism for advancing and retracting the carrying arm and a mechanism for moving the carrying arm along a carrying passage. Those mechanisms for a carrying arm for carrying a large substrate are inevitably large. Driving units for driving those mechanisms are considerably large when the carrying arm carries, for example, a 12 in. diameter or 16 in. diameter wafer. When such large driving units are used, a dust removing measure, such as creation of special exhaust flow, needs to be taken to suppress the adhesion of particles produced by the abrasion of the driving units to the substrate. A large semiconductor device fabricating system is needed to process a large substrate. Therefore, the semiconductor device fabricating system needs to be built in the simplest possible construction.

In view of those necessary conditions, a substrate carrying mechanism that carries a substrate by a carrying method that floats a substrate by the agency of a gas and carries the floating substrate is advantageous because a carrying device provided with such a substrate carrying mechanism can be built in a thin structure. A known substrate carrying mechanism mentioned in, for example, Patent document 1 carries a substrate by such a carrying method. This known substrate carrying mechanism will be briefly described with reference to FIGS. 19(a) and 19(b) respectively showing this known substrate carrying mechanism in a top view and a longitudinal sectional view. Shown in FIGS. 19(a) and 19(b) are a flat structure 11 forming a carrying passage, and a top plate 12 included in the flat structure 11. Many gas spouting pores 13 are arranged at intervals all over the top plate 12. The gas spouting pores 13 extend obliquely through the top plate 12. As shown in FIG. 19(c), the gas spouting pores 13 are formed such that the gas is spouted obliquely upward in a direction from one end, namely, a first end on the left-hand side in FIG. 19(c), toward the other end, namely, a second end on the right-hand side in FIG. 19(c), of the carrying passage through the gas spouting pores 13. A bottom member is attached to the top plate 12 to define a closed space 15. A gas supply pipe 16 has one end connected to the flat structure 11 and the other end connected to a gas source to supply, a compressed gas, such as compressed air, into the closed space 15.

Compressed air is supplied through the gas supply pipe 16 into the closed space 15 after the wafer W, namely, a substrate, has been placed on a part of the carrying passage on the side of the first end in this substrate carrying mechanism. The air is spouted through the gas spouting pores 13 obliquely upward as shown in FIG. 19(c) The air pushes up the wafer W from the top plate 12 to float the wafer W. The air flows along the lower surface of the wafer W toward the second end of the carrying passage to propel the floating wafer W toward the second end of the carrying passage. Thus the wafer W is carried from the first end to the second end of the carrying passage.

Since any frictional force acts on the floating wafer W, the wafer W is unstable and is moved by a slight force. Thus the substrate is liable to be caused to drift longitudinally or transversely by a slight force. Therefore, the gas spouting pores 13 need to be precisely formed to prevent the wafer W from drifting away from a correct position. However, it is difficult, in general, to form many pores obliquely to the thickness of such a plate and hence it is possible that the air flow for carrying the wafer W is disturbed to cause troubles in carrying the wafer W and the substrate carrying mechanism needs a high manufacturing cost.

Air of a high cleanliness must be used for carrying the wafer W so that the air may not affect a process for processing the carried wafer W adversely. Air consumption rate increases with the length of the carrying passage and hence the running cost of the substrate carrying mechanism is high when the carrying passage is long.

Although methods that use air for carrying a substrate are widely known, practical application of those methods is difficult because of those foregoing problems.

For example, a coating and developing system for coating a substrate with a resist film and processing the substrate by a developing process has many processing units Those processing units are stacked in layers in processing blocks. Efforts are made to carry a substrate directly from one to the other of the processing unit of the block. Although a flotation carrying mechanism is thin and is advantageous in carrying a substrate for a long distance. The foregoing problems hinder the practical application of the flotation carrying mechanism.

Patent document 1: JP-A 57-128940, p. 2, II. 12 to 17, lower left-hand col.

SUMMARY OF THE INVENTION

The present invention has been made under such circumstances and it is therefore an object of the present invention to provide a flotation substrate carrying device capable of being manufactured at a low manufacturing cost and of carrying a substrate at a low gas consumption rate, a substrate carrying method and a storage medium storing computer-readable programs for accomplishing the substrate carrying method.

A substrate carrying device in a first aspect of the present invention includes: a carrying passage forming member forming a carrying passage along which a substrate is carried; exhaust grooves extending parallel to the carrying passage in the upper surface of the carrying passage forming member; a plurality of pairs each of right and left carrying gas flow grooves formed in the upper surface of the carrying passage forming member, inclined to a substrate carrying direction so as to approach the exhaust grooves from the right-hand side and the left-hand side of the exhaust grooves, respectively, and having inner ends joined to the exhaust grooves, respectively; and gas spouting pores formed near the outer ends of the carrying gas flow grooves to spout a gas for floating a substrate and for creating substrate carrying air flows flowing from outer ends of the carrying gas flow grooves toward inner ends of the carrying gas flow grooves.

A substrate carrying device in a second aspect of the present invention includes: a carrying passage forming member forming a carrying passage; gas spouting pores formed in the carrying passage forming member and arranged along the carrying passage to spout a gas for causing a substrate to float; and a gas spouting unit disposed above the carrying passage, provided with gas spouting pores for spouting a carrying gas obliquely downward toward the substrate to produce gas flows flowing in a substrate carrying direction on the carrying passage to carry the substrate. Each of those substrate carrying devices may include, for example, gas supply control means for controlling starting and stopping supplying the gas to groups of the gas spouting pores assigned to passage sections defined by longitudinally dividing the carrying passage such that the groups of the gas spouting pores start spouting the gas and stop spouting the gas independently, position measuring means for measuring the position of the substrate on the carrying passage, and a control unit for controlling opening and closing operations of the gas supply control means for controlling starting and stopping supplying the gas to the groups of the spouting pores on the basis of measured data provided by the position measuring means.

A substrate carrying device in a third aspect of the present invention includes: a carrying passage forming member forming a carrying passage extending in a substrate carrying direction; flotation gas spouting pores formed in the carrying passage forming member and arranged along the carrying passage to spout a flotation gas for causing a substrate to float; carrying gas spouting pores formed in the carrying passage forming member to create gas flows for carrying the floating substrate along the carrying passage; gas supply control means for controlling starting and stopping supplying the gas to groups of the gas spouting pores assigned to passage sections defined by longitudinally dividing the carrying passage such that the groups of the gas spouting pores start spouting the gas and stop spouting the gas independently; position measuring means for measuring the position of the substrate on the carrying passage; and a control unit for controlling opening and closing operations of the gas supply control means for controlling starting and stopping supplying the gas to the groups of the spouting pores on the basis of measured data provided by the position measuring means.

The position sensing means are, for example, substrate detectors disposed in the passage sections, respectively, to detect the substrate. The substrate carrying device may be provided with floating height measuring means for measuring the floating height of the substrate from the carrying passage, and a decision means for deciding whether or not the substrate is at a predetermined floating height on the basis of the floating height measured by the floating height measuring means.

A substrate carrying method in a fourth aspect of the present invention includes the steps of: placing a substrate on a carrying passage forming member forming a carrying passage; causing the substrate to float by spouting a gas through gas spouting pores formed in the upper surface of the carrying passage forming member, near the outer ends of carrying gas flow grooves inclined to a substrate carrying direction so as to approach exhaust grooves from the right-hand side and the left-hand side of the exhaust grooves extending parallel to the carrying passage in the upper surface of the carrying passage forming member, respectively, and having inner ends joined to the exhaust grooves; and creating gas flows flowing from outer ends toward the inner ends of the carrying gas flow grooves to carry the substrate.

A substrate carrying method in a fifth aspect of the present invention includes the steps of: spouting a flotation gas for causing a substrate to float through gas spouting pores formed in a carrying passage forming member extending in a substrate carrying direction, and arranged along a carrying passage; and creating gas flows flowing in the substrate carrying direction and capable of moving the substrate in the substrate carrying direction by spouting a carrying gas obliquely downward by a gas spouting unit disposed above the carrying passage.

A substrate carrying method in a sixth aspect of the present invention includes the steps of: spouting a flotation gas through flotation gas spouting pores formed in a carrying passage forming member extending in a substrate carrying direction and arranged along a carrying passage to cause a substrate to float; spouting a carrying gas through carrying gas spouting pores to create gas flows for carrying the substrate along the carrying passage; making groups of the gas spouting pores assigned to passage sections defined by longitudinally dividing the carrying passage start and stop supplying the gas independently by gas supply control means; measuring the position of the substrate on the carrying passage by position sensing means; and controlling opening and closing operations of the gas supply control means for controlling starting and stopping supplying the gas to the groups of the spouting pores on the basis of measured data provided by the position sensing means.

The substrate carrying method includes, for example, the steps of measuring the position of the substrate on the carrying passage in the carrying direction; and controlling opening and closing operations of the gas supply control means for controlling starting and stopping supplying the gas to the groups of the spouting pores assigned to the passage sections on the basis of measured data obtained in the step of measuring the position of the substrate. The substrate carrying method includes, for example, the steps of: measuring the floating height of the substrate from the carrying passage; and deciding whether or not the substrate is at a predetermined floating height on the basis of measured floating height of the substrate. Those steps of the substrate carrying method are executed by, for example, a substrate carrying device provided with a computer-readable storage medium storing a programs for accomplishing the steps of the substrate carrying method, and capable of carrying the substrate floating above the carrying passage along the carrying passage.

In the substrate carrying device of the present invention, the longitudinal exhaust grooves are formed parallel to the carrying passage in the upper surface of the carrying passage forming member; the plurality of pairs each of right and left carrying gas flow grooves formed in the upper surface of the carrying passage forming member, extending obliquely to a substrate carrying direction so as to approach the exhaust grooves from the right side and the left side of the exhaust grooves, respectively, and having inner ends joined to the exhaust grooves, and the gas spouting pores are formed near the outer ends of the carrying gas flow grooves. The gas spouted through the gas spouting pores floats the substrate and flows through the carrying gas flow grooves into the exhaust grooves, and gas flows flowing through the carrying gas flow grooves into the exhaust grooves propel the substrate so as to move along the carrying passage. The carrying passage forming member can be made by easy machining work because the gas spouting pores need to be formed to spout the gas merely vertically upward.

The present invention divides the carrying passage longitudinally into the plurality of passage sections, the position of the substrate on the carrying passage with respect to the carrying direction, and controls starting and stopping supplying the gas to the groups of the gas spouting pores assigned to the passage sections on the basis of the measured position of the substrate such that the groups of the gas spouting pores start spouting the gas and stop spouting the gas independently. Therefore, the useless consumption of the gas can be suppressed.

DESCRIPTION OF THE PREFERRED EMBODIMENTS

FIGS. 1 to 4 show a substrate carrying device in a first embodiment according to the present invention, in which indicated at 2 is an elongate carrying passage forming plate, namely, carrying passage forming member, forming a carrying passage. The carrying passage forming plate 2 is extended horizontally. An entrance table 3 and an exit table 4 are formed at a first end, i.e., a left-hand end as viewed in FIG. 1, and at a second end, i.e., a right-hand end as viewed in FIG. 1, respectively. A U-shaped carrying arm 20 of an external carrying mechanism delivers a semiconductor wafer W (hereinafter, referred to simply as "wafer"), namely, a substrate, on the entrance table 3. Three lifting pins 41 capable of being vertically moved are arranged on the entrance plate 3. The lifting pins 41 are moved vertically to transfer the wafer W between the carrying arm 20 and the entrance table 3. Similarly, three lifting pins 41 capable of being vertically moved are arranged on the exit plate 3. The lifting pins 41 are moved vertically to transfer the wafer W between the exit table 4 and a carrying arm, not shown.

Figure 1:
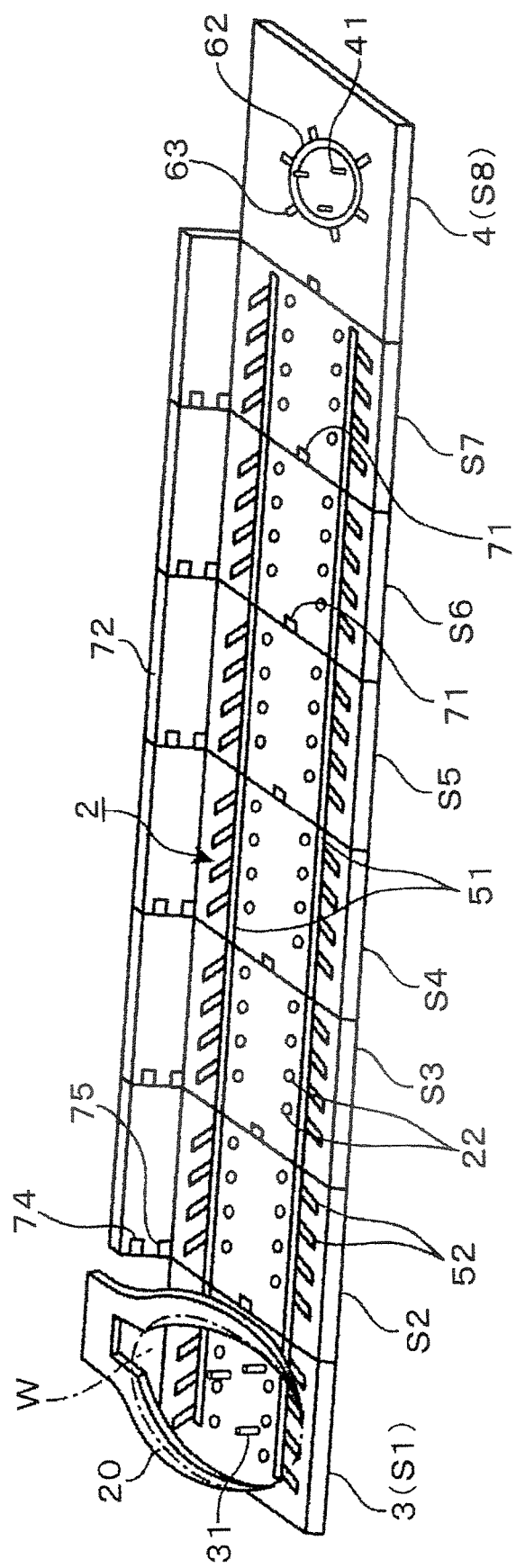
FIG. 1 is a perspective view of a substrate carrying device in a first embodiment according to the present invention.
Figure 2:
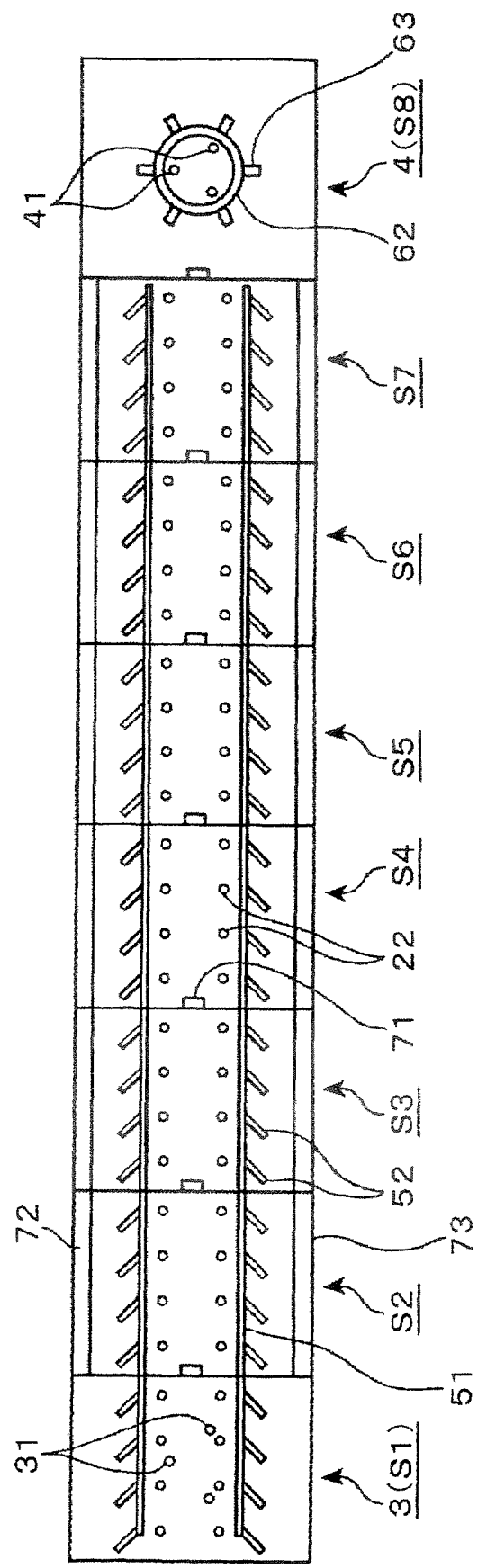
FIG. 2 is a top view of the substrate carrying device in the first embodiment.

The carrying passage forming plate 2 is divided into a plurality of passage sections successively arranged in a carrying direction. In FIG. 1, the carrying passage forming plate 2 is divided into eight passage sections S1 to S8. The entrance table 3 is the first passage section S1 and the exit table 4 is the eighth passage section S8.

For example, pairs of flotation gas spouting pores 22 penetrate the passage sections S1 to S7 vertically. The pairs of flotation gas spouting pores 22 are arranged in two transversely spaced longitudinal rows, respectively. The pairs of flotation gas spouting pores 22 are arranged at intervals in the carrying direction. The gas is spouted vertically upward through the flotation gas spouting pores 22 and gas spouting pores 53 to cause the wafer W to float above the carrying passage forming plate 2.

Two parallel exhaust grooves 51 are formed in the upper surface of the carrying passage forming plate 2 through the passage sections S1 to S7 so as to extend in the carrying direction on the outer side of the two rows of the flotation gas spouting pores 22, respectively. Carrying gas flow grooves 52 are formed in the upper surface of the carrying passage forming plate 2 on the outer side of the exhaust grooves 51, respectively. The carrying gas flow grooves 52 are formed so as to approach the exhaust grooves 51 in the carrying direction. Inner ends of the carrying gas flow grooves 52 are joined to the exhaust grooves 51, respectively. The carrying gas flow grooves 52 are formed in pairs arranged along the carrying passage at intervals. The pairs of carrying gas flow grooves 52 are symmetrical with respect to the center line of the carrying passage forming plate 2. Thus the carrying gas flow grooves 52 extend obliquely to the exhaust grooves and the inner ends thereof are joined to the exhaust grooves 51, respectively.

Figure 5:
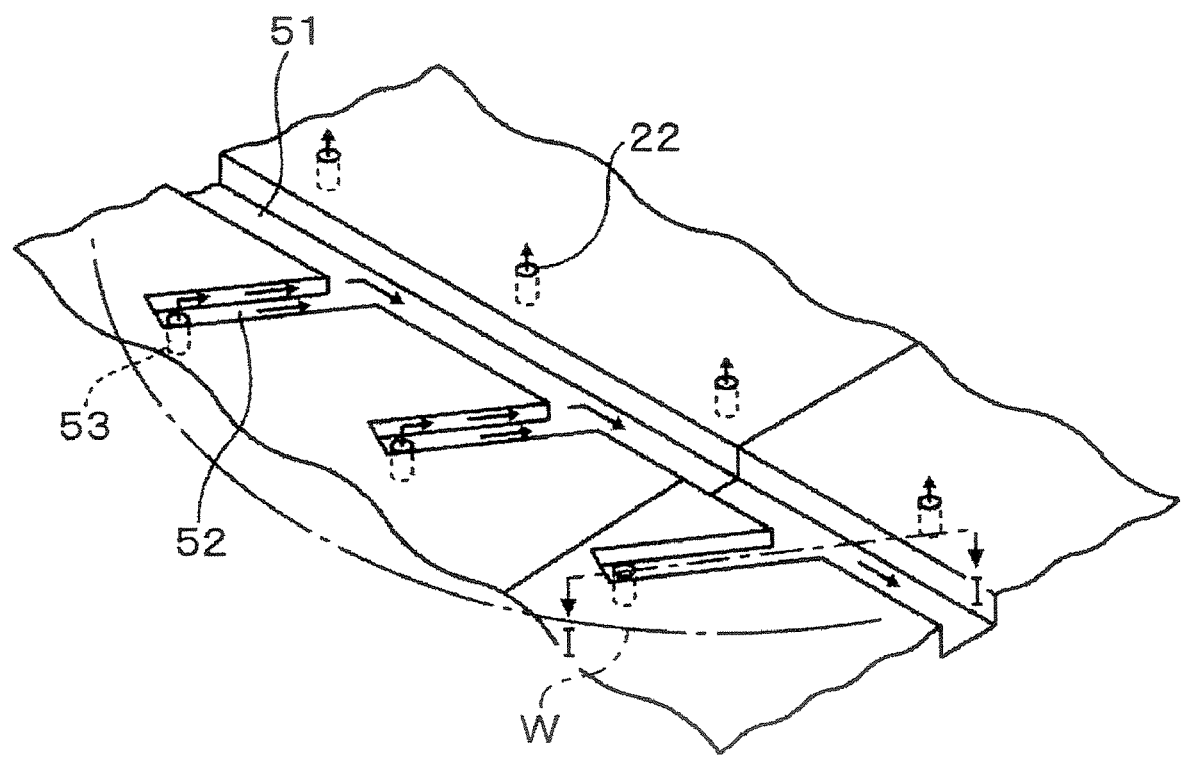
FIG. 5 is a perspective view of a surface of a carrying passage forming member, provided with a carrying passage, included in the substrate carrying device in the first embodiment.
Figure 6:
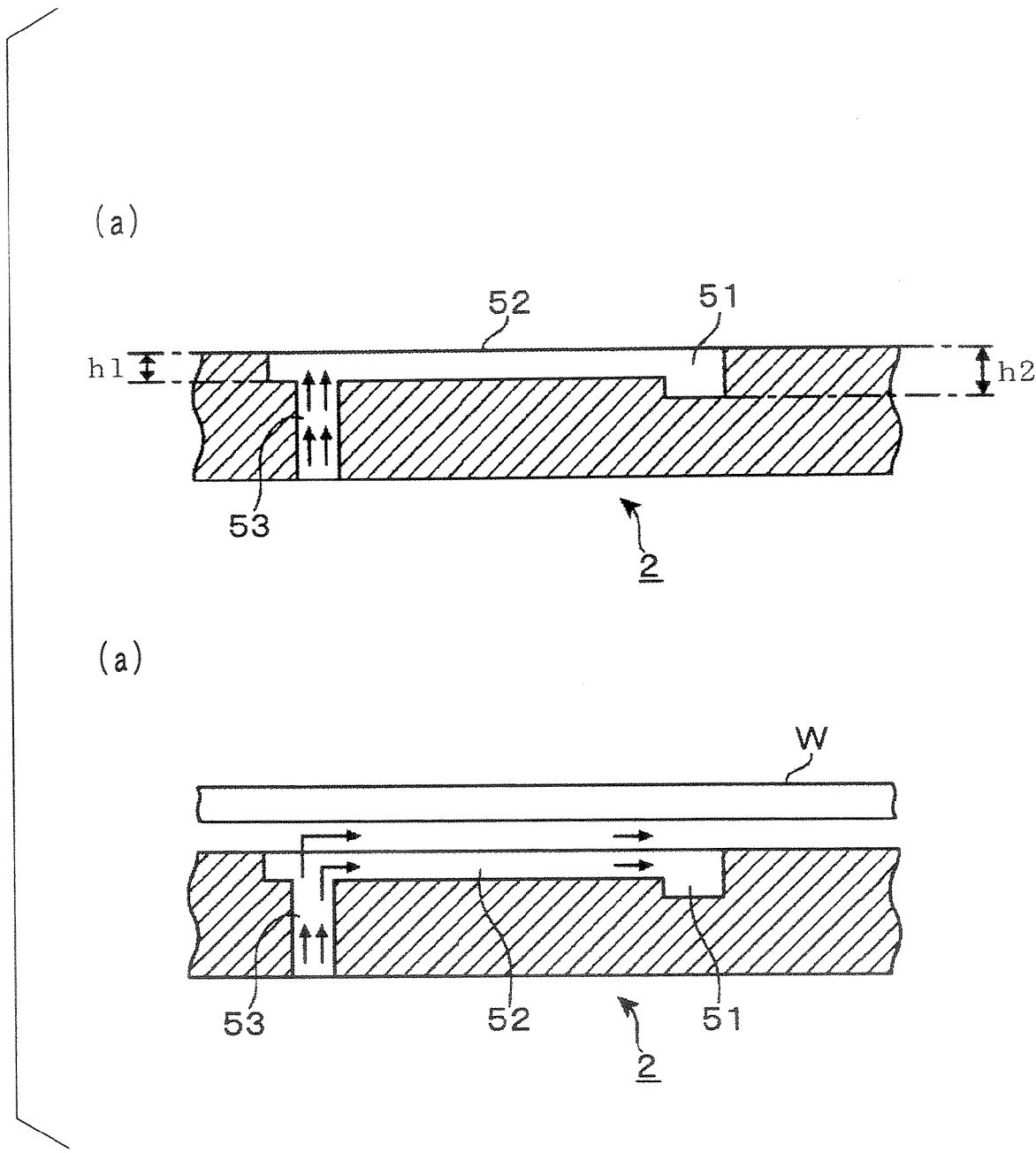
FIG. 6 is a longitudinal sectional view of the carrying passage forming member shown in FIG. 5.
Figure 7:
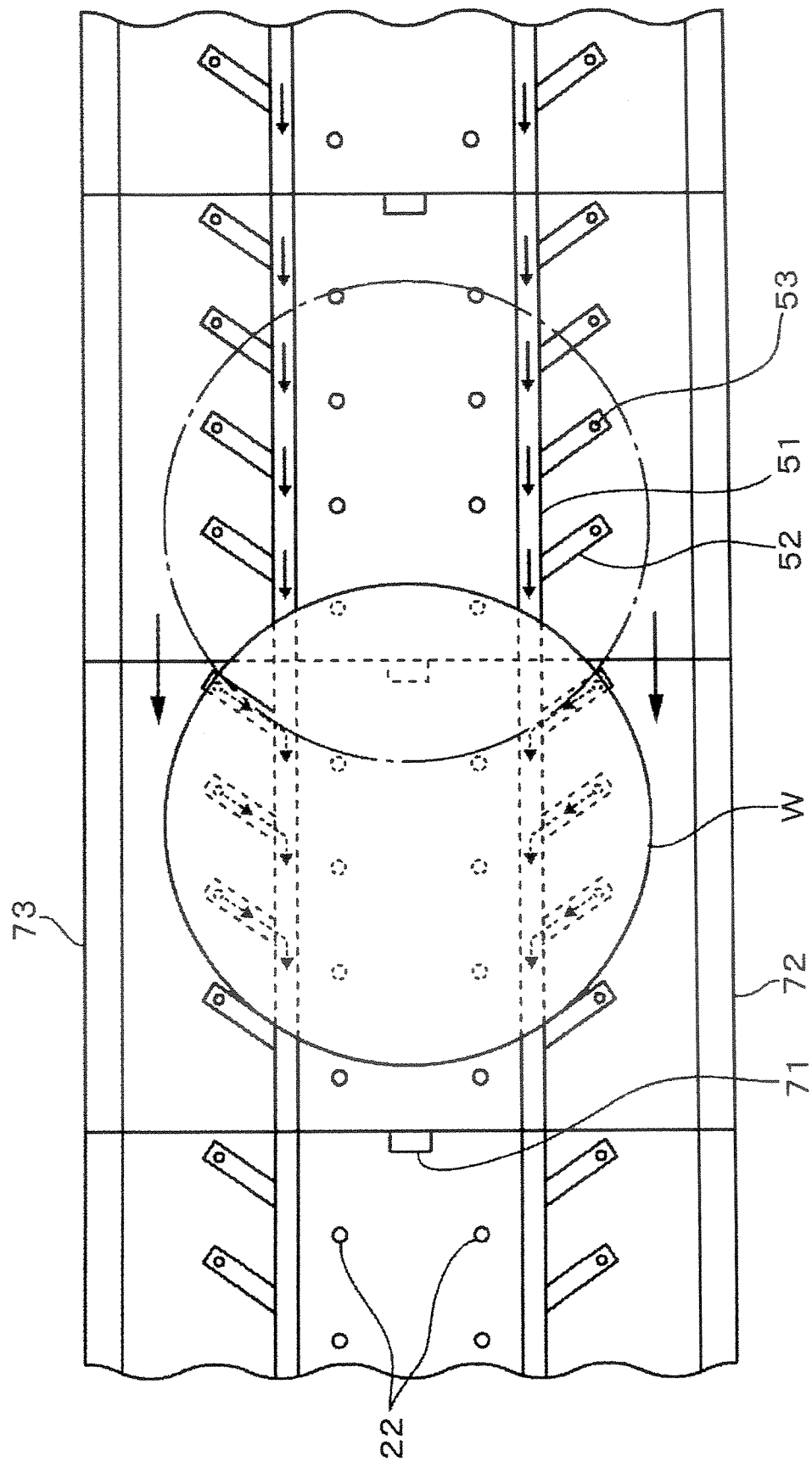
FIG. 7 is plan view showing a wafer being carried along the carrying passage.

The carrying gas flow grooves 52 and parts around the flow grooves 52 will be described with reference to FIGS. 5 and 6. FIG. 5 is an enlarged perspective view of the flow grooves 52 and parts around the flow grooves 52. FIG. 6 is a sectional view taken on the line I-I in FIG. 5. Referring to FIG. 6($a$), the carrying gas flow groove 52 has a depth h1 between 0.5 and 1.0 mm. The gas spouting pore 53 extends vertically through a part of the carrying passage forming plate 2 corresponding to an outer end of the carrying gas flow groove 52. The exhaust groove 51 is formed in a depth greater than that of the carrying gas flow groove 52 to discharge efficiently air spouted through the gas spouting pore 53 through the exhaust groove 51. For example, the exhaust groove 51 has a depth h2 between 1.0 and 2.0 mm.

Figure 8:
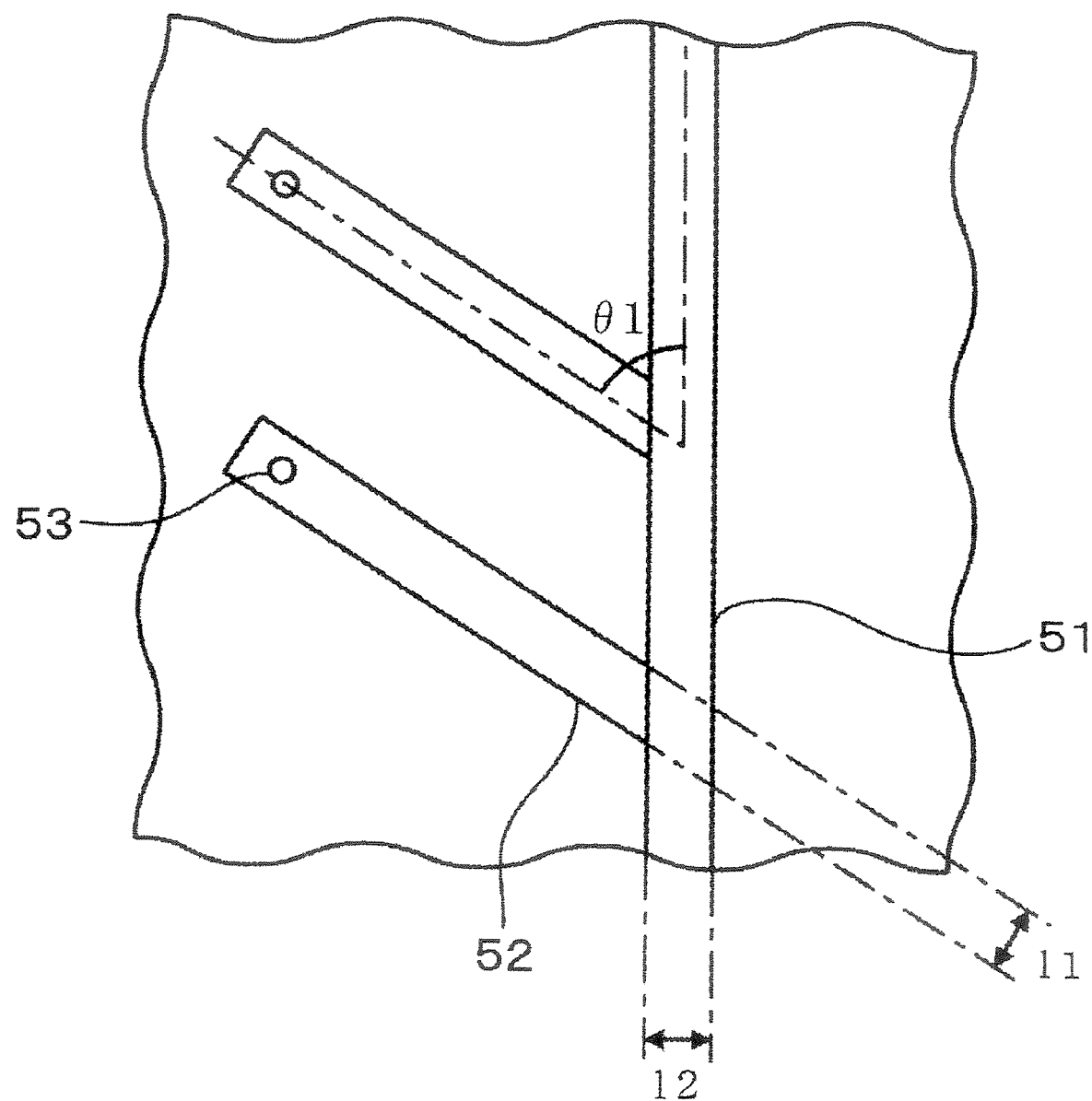
FIG. 8 is a plan view of a carrying gas flow groove and an exhaust groove formed in the carrying passage forming member.

As shown in FIG. 6($a$), the gas spouting pore 53 opening into the carrying gas flow groove 52 is formed so as to spout air vertically upward. When the wafer W is above the gas spouting pores 53, air spouted through the gas spouting pores 53 and the flotation gas spouting pores 22 pushes up the wafer W to float the wafer W above the carrying passage forming plate 2 and flows into the exhaust grooves 51 as indicated by the arrows The air spouted through the gas spouting pores 53 against the wafer W is caused to flow into the exhaust grooves 51 by pressure gradient in the vicinity of the gas spouting pores 53. Air flowing through the carrying gas flow grooves 52 exerts a longitudinal force in a direction from the entrance table 3 toward the exit table 4 and transverse forces in directions toward the center line of the carrying passage on the wafer W. Consequently, the wafer W is moved toward the exit table 4 with its center held on the center line of the carrying passage. As shown in FIG. 8, the angle θ1 between the respective center axis of the carrying gas flow groove 52 and the exhaust groove 51 in a horizontal plane is, for example, between 30° and 60°. For example, the carrying gas flow groove 52 has a width 11 between 3 and 10 mm and the exhaust groove 51 has a width 12 between 7 and 20 mm.

The wafer W is carried from the entrance table 3 toward the exit table 4. Therefore, air flows through the carrying gas flow grooves 52 into the exhaust grooves 51 and flows downstream through the exhaust grooves 51. Air starts flowing through the upstream carrying gas flow grooves 52 on the side of the entrance table 3 and flows successively through the downstream carrying gas flow grooves 52.

Figure 4:
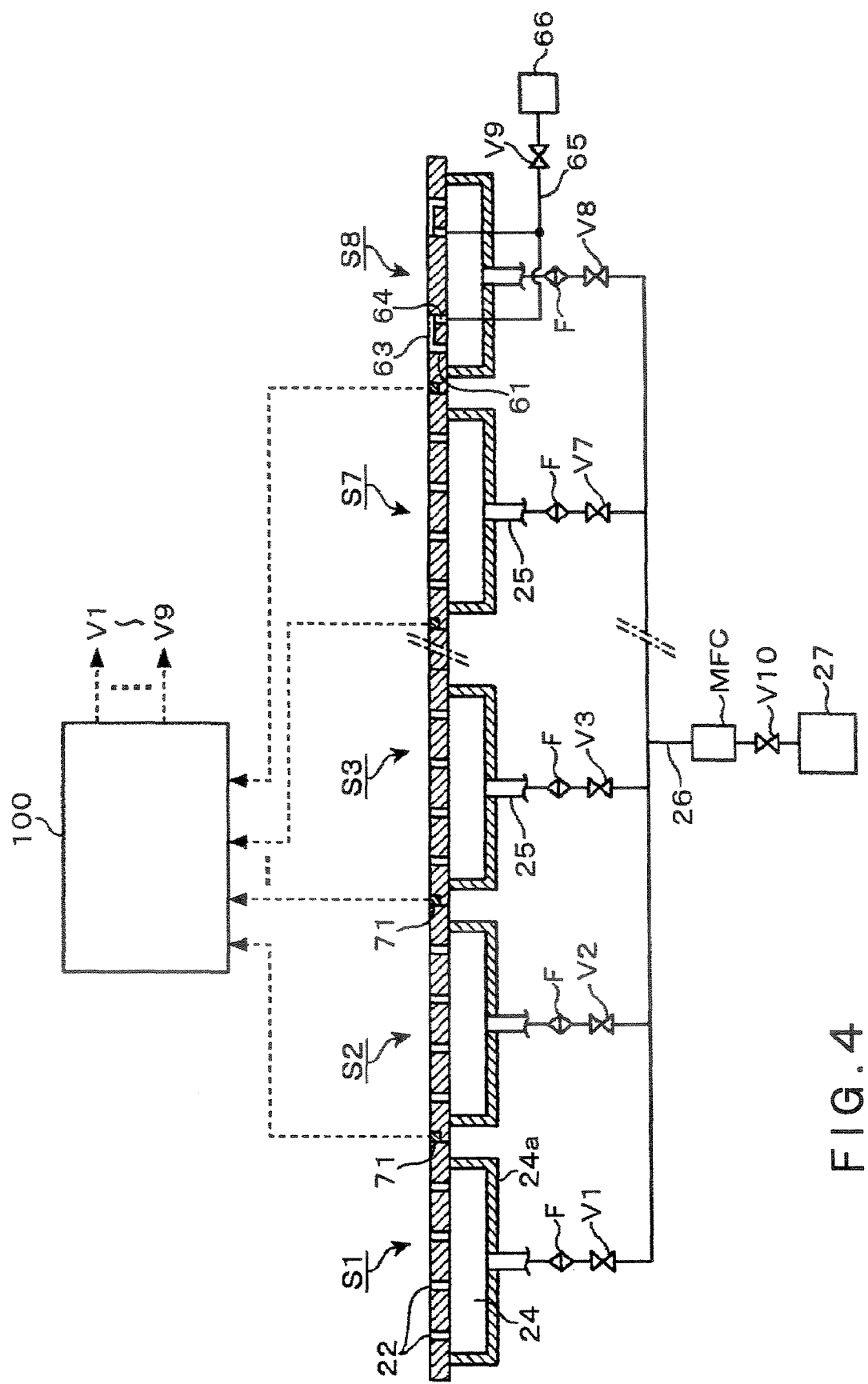
FIG. 4 is a longitudinal sectional view of the substrate carrying device in the first embodiment.
Figure 9:
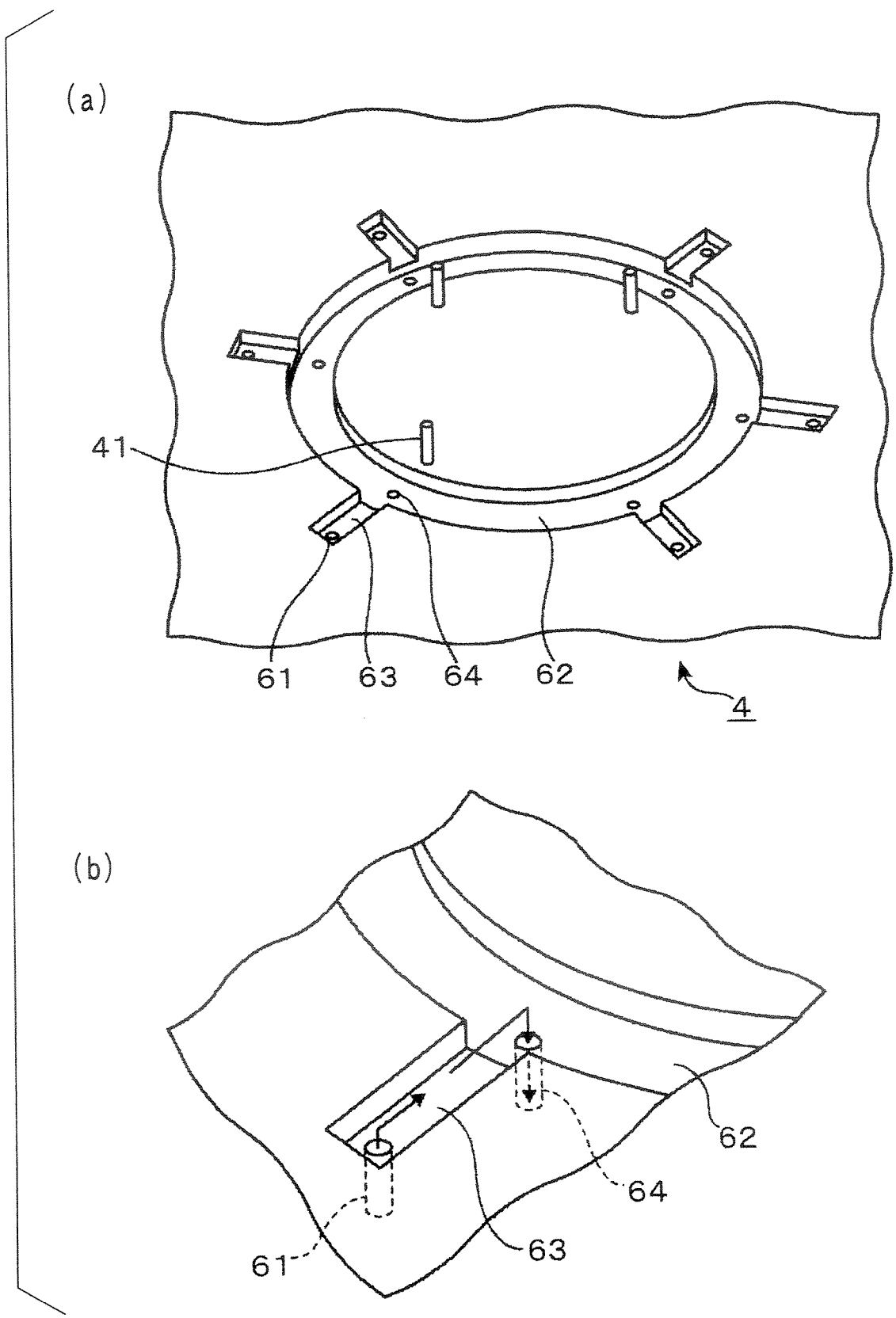
FIG. 9 is a perspective view of an end part of the carrying passage.

The exit table 4 at the second end of the carrying passage will be described with reference to FIG. 9(*a*) showing a central part of the exit table 4 in a perspective view. A plurality of positioning gas spouting pores 61, i.e., six positioning gas spouting pores 61 in this embodiment, are formed in the central part on a first circle having a diameter smaller than that of the wafer W and its center at the center of the central part. An annular groove 62 is formed along a second circle concentric with the first circle and having a diameter smaller than that of the first circle. Radial positioning gas flow grooves 63 extend toward the positioning gas spouting pores 61, respectively, from the annular groove 62. The positioning gas flow grooves 63 are used for positioning the wafer W on the exit table 4. Suction pores 64 are formed in the bottom of the annular groove 62 respectively on the center lines of the positioning gas flow grooves 63. As shown in FIG. 4, a exhaust pipe 65 extended under the carrying passage forming plate 2 has one end connected to the suction pores 64 and the other end connected through a valve V9 to a suction device 66, such as a vacuum pump, disposed outside an air chamber, which will be described later.

When the wafer W carried downstream along the carrying passage is transferred from the seventh passage section S7 to the exit table 4, air is spouted through the gas spouting pores 61. Discharge of air through the suction pores 64 is started substantially simultaneously with the start of spouting air through the gas spouting pores 61. Thus air flows from each gas spouting pore 61 through the radial positioning gas flow groove 63 toward the suction pore 64 as indicated by the arrows in FIG. 9(*b*). The wafer W delivered to the exit table 4 is floated above the exit table 4, is positioned at a predetermined position and held stationary by the flow of air.

The positional relation between the suction pores 64 and the gas spouting pores 61 on the exit table may be reversed; that is, the suction pores 64 may be formed at outer ends of the positioning gas flow grooves 63, respectively, and the gas spouting pores 61 may be formed in the annular groove 62. When the air is spouted through the gas spouting pores 61 and is discharged through the suction pores 64 in this state, air flows from the annular groove 62 toward the outer ends of the positioning gas flow grooves 63. Thus the wafer W may be positioned on the exit table 4 by air flows flowing radially outward on the exit table 4.

Figure 10:
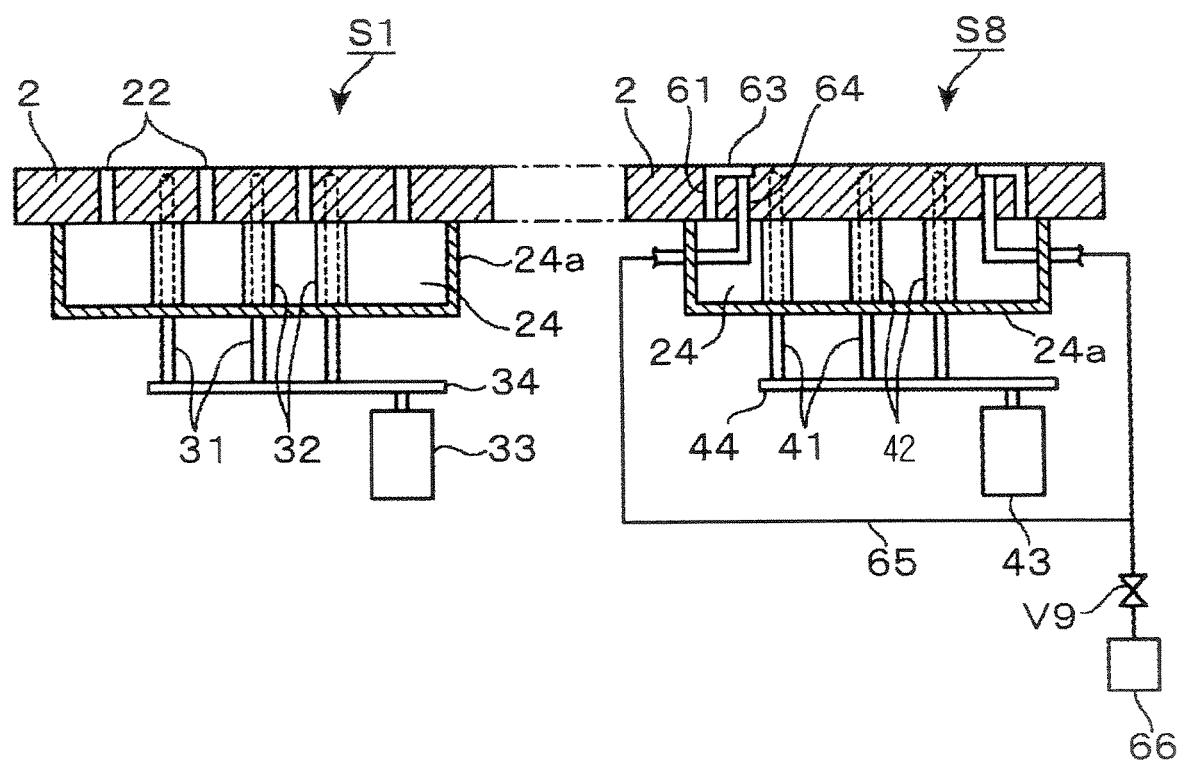
FIG. 10 is a longitudinal sectional view of opposite end parts of the carrying passage.

The passage sections S1 to S8 are controlled so as to spout the gas through the gas spouting pores 22, 53 and 61 independently. As shown in FIG. 4, air chambers 24 are formed under the passage sections S1 to S8 by air chamber forming members 24a, respectively. The respective inlet ends of the gas spouting pores 22, 53 and 61 open into the air chambers 24. In the passage section S1 (the passage section S8), sleeves 32 (sleeves 42) are disposed in the air chamber 24 at positions corresponding to the lifting pins 31 (the lifting pins 41) as shown in FIG. 10. As shown in FIG. 10, the lifting pins 31 (the lifting pins 41) are extended upward from below the air chamber 24 so as to move vertically through the sleeves 32 (the sleeves 42) and bores formed in the entrance table 3 (the exit table 4). In FIG. 10, indicated at 33 (43) is a lifting mechanism for vertically moving a support member 34 (support member 44) supporting the lifting pins 31 (lifting pins 41). The carrying passage forming plate 2 may be a single plate or may be a sectional plate formed by connecting plates forming the passage sections S1 to S8.

Gas supply pipes 25 respectively provided with valves V1 to V8 are connected to the air chambers 24, respectively. Filters F for removing particles are placed in the gas supply pipes, respectively. Upstream ends of the gas supply pipes 25 are connected to a main gas supply pipe 26 provided with a mass flow controller MFC, namely, a flow regulator, and a valve 10. The main gas supply pipe 26 is connected to a gas source 27.

The passage sections S2 to S8 are provided with safer detectors 71, such as reflex optical sensors, namely, light sensors, or capacitance type sensors, respectively. In this embodiment, the wafer detectors 71 are disposed at the upstream ends of the passage sections S2 to S8 on the center line of the carrying passage. The wafer detectors 71 are connected to a controller 100 as shown in FIG. 4. The controller 100 determines a measured position of the wafer W on the basis of detection signals provided by the wafer detectors 71. The controller 100 is provided with, for example, a program, namely, software, for controlling the valves V1 to V9 on the basis of the measured position of the wafer W.

The program is designed, for example, to open the valve, among the valves V2 to V9, corresponding to the passage section in which the wafer W is detected by the wafer detector 71 among the passage sections S2 to S7 to spout air, and closes the same valve upon the detection of the wafer W by the wafer detector 71 of the downstream passage section contiguous with the former passage section to stop spouting air in the former passage section. The program includes directions for accomplishing steps of the operation of the substrate carrying device. For example, the valve V2 is opened when the wafer sensor 71 disposed at the entrance of the passage section S2 goes ON, and the valve V2 is closed when the wafer detector 71 disposed at the entrance of the passage section S3 goes ON.

The controller 100 has a computer provided with a program storage unit storing the program. The controller 100 reads the program from the program storage unit and executes the steps specified by the program. A storage medium, such as a hard disk, a compact disk, a magnetooptical disk or a memory card, storing the program is held in the program storage unit.

The valve V1 is opened to spout the gas through the gas spouting pores 22 and 53 in the first passage section S1, namely, the entrance table 3, for example, in a state where the lifting pins 31 are at their upper positions, the wafer W is supported on the lifting pins 31, the lifting pins 41 of the exit table 4 are at their lower position, and any wafer W is not on the exit table 4. The valve V1 is closed when the wafer detector 71 disposed at the entrance of the second passage section S2 goes ON to stop spouting the gas through the gas spouting pores 22 and 53 in the first passage section S1. The valves V8 and V9 are opened to spout air through the gas spouting pores 61 and to discharge air through the suction pores 64 so that air flows through the positioning gas flow grooves 64 toward the center of the exit table 4 when the wafer detector 71 disposed at the entrance of the eighth passage section S8 goes ON. The valves V8 and V9 are closed when the lifting pins 41 are raised to their upper positions. The program is designed to execute those operations sequentially.

Figure 3:
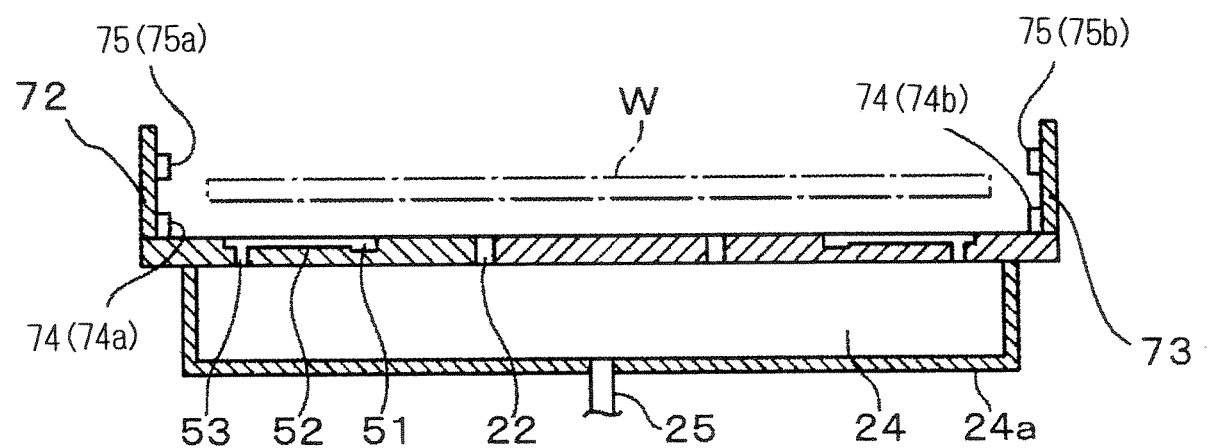
FIG. 3 is a cross-sectional view of the substrate carrying device in the first embodiment.
Figure 11:
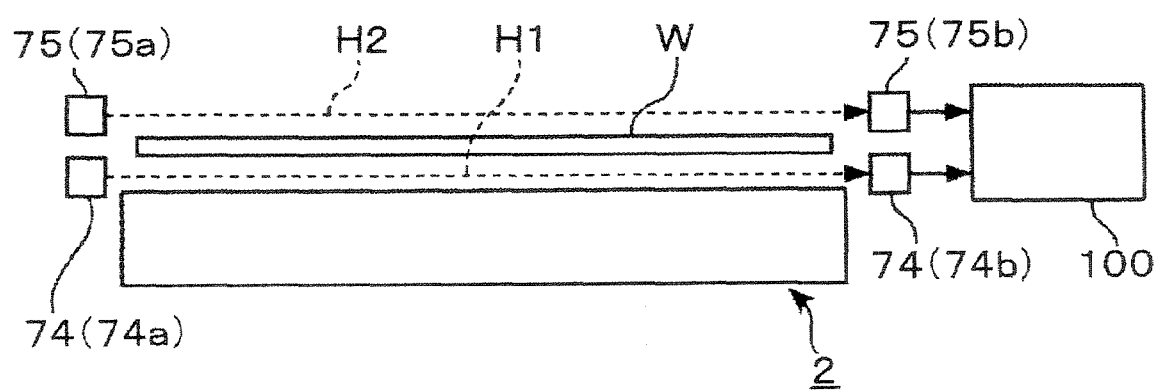
FIG. 11 is a schematic side elevation of assistance in explaining a method of measuring the floating height of a substrate.

Guide members 72 are arranged in a row and guide members 73 are arranged in a row on the opposite side edges, respectively, of the passage sections S2 to S7 of the carrying passage forming plate 2 as shown in FIGS. 1 and 3 to prevent the wafer W deviated from a correct course from falling off the carrying passage forming plate 2. In FIG. 1, the guide members 73 are omitted. The guide members 72 and 73 respectively corresponding, for example, the passage sections S2 to S7 are provided with floating height measuring device for measuring the floating height of the wafer W from the upper surface of the carrying passage forming plate 2. In this embodiment, floating height measuring devices 74 and 75, such as transmission type optical sensors, are disposed with their optical axes extended on a lower height level H1 lower than a normal floating height of, for example, 1.0 mm of the floating wafer W and on an upper height level H2 higher than the normal floating height, respectively, as shown in FIG. 11. The floating height measuring device 74 (75) has a light emitter 74a (75a) and a light receiver 74b (75b) held on the guide members 72 and 73, respectively.

Actually, a plurality of floating height measuring devices like the floating height measuring device 74 or the floating height measuring device 75 are arranged at vertical intervals smaller than the thickness of the wafer W to detect the wafer in a predetermined floating height range.

The controller 100 receives an output signal provided by the light receiver 74b (75b). The controller 100 provides an alarm signal upon the reception of an output signal provided by the light receiver 74b or the light receiver 75b. For example, the controller 100 may provide a signal or may display an indication to the effect that the lifting force acting on the wafer W is excessively low upon the reception of a wafer detection signal from the light receiver 74b or to the effect that the lifting force acting on the wafer W is excessively high upon the reception of a wafer detection signal from the light receiver 75b.

The controller 100 is capable of measuring time between the detection of the wafer W by the wafer detector 71 of the second passage section S2 and detection of the wafer W by the wafer detector 71 of the eighth passage section S8. The controller 100 is capable of providing an alarm signal to the effect that the wafer W is stopping in the carrying passage when the wafer detector 71 of the eighth passage section S8 does not detect the wafer W after a predetermined time has elapsed since the detection of the wafer W by the wafer detector 71 of the second passage section S2.

The operation of the substrate carrying device in this embodiment will be described. The wafer W held by the carrying arm 20 is carried to a position above the entrance table 3 on the first side of the carrying passage forming plate 2 as shown in FIG. 1. Then, the lifting pins 31 are raised to push up the wafer W from the carrying arm 20 and to support the wafer W thereon. Subsequently, the carrying arm 20 is retracted, the lifting pins 31 are lowered to place the wafer W on the entrance table 3. Then, the valves V1 and V10 (FIG. 4) are opened to spout air through the flotation gas spouting pores 22 and the gas spouting pores 53 of the entrance table 3, provided that any wafer W is not placed on the exit table 4 on the second side of the carrying passage forming plate 2.

The air spouted through the gas spouting pores 22 and 53 causes the wafer W to float above the carrying passage forming plate 2. The air spouted through the gas spouting pores 53 is deflected by the wafer W so as to flow through the carrying gas flow grooves 52 into the exhaust grooves 51. Since any frictional force is acting on the floating wafer W, the wafer W is caused to start moving downstream above the carrying passage forming plate 2 by the air flowing through the carrying gas flow grooves 52. The valves V2 to V8 for the passage sections S2 to S8 are closed while the wafer W is moving above the entrance table 3. The wafer detector 71 of the second passage section S2 detects the wafer W upon the passage of the wafer past the entrance of the second passage section S2. Then, the valve V2 for the second passage section S2 is opened to spout air through the gas spouting pores 22 and 53 of the second passage section S2.

Figure 12:
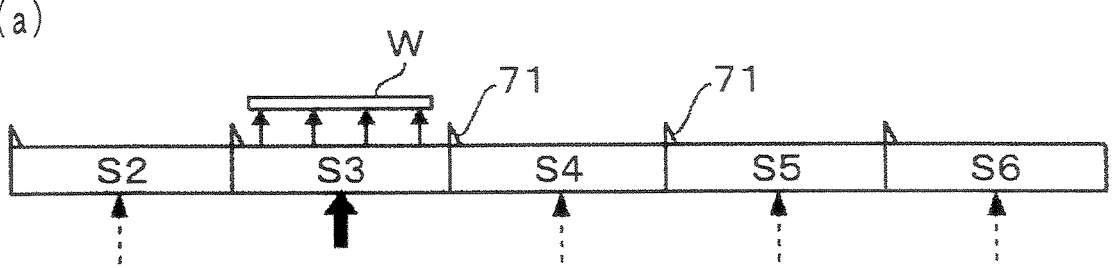
FIG. 12 is a diagrammatic view of assistance in explaining the successive starting and stopping of spouting the gas through the groups of gas spouting pores.
Figure 12:
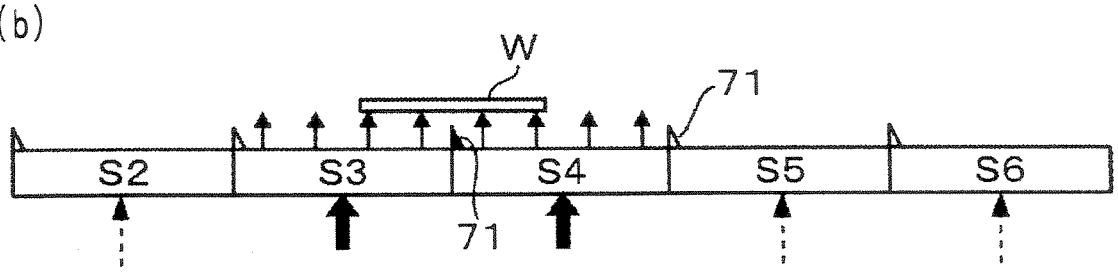
Figure 12:
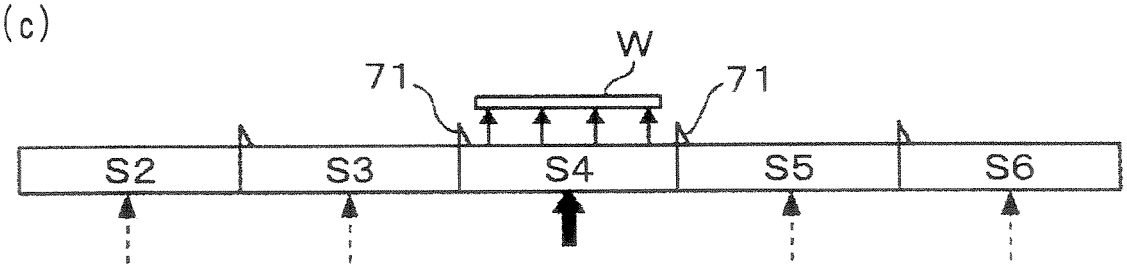

Thus the wafer W is moved downstream in the second passage section S2. The floating height of the floating wafer W is, for example, 1.0 mm. FIG. 12 shows the relation between the position of the wafer W and an air spouting operation. Suppose that the wafer W is within a range corresponding to the third passage section S3. Then, air is spouted only in the third passage section S3. The wafer W advances past the boundary between the passage sections S3 and S4. Then, the wafer detector 71 of the fourth passage section S4 goes ON and the valve V4 is opened to spout air in the fourth passage section S4. Thus the wafer W is caused to float by the air spouted in the passage sections S3 and S4. After the wafer W has advanced past the third passage section S3 and the wafer detector 71 at the entrance of the fourth passage section S4 goes OFF, the valve V3 for the third passage section S3 is closed to stop spouting air in the third passage section S3.

As the wafer W advances through the passage sections S1 to S8, air is spouted only in the passage sections in which air needs to be spouted. Thus the wafer W is moved downstream by the air flow flowing through the carrying gas flow grooves 52 to the exit table 4 while the wafer W is centered on the carrying passage with respect to the center line of the carrying passage forming plate 2. The wafer detector 71 disposed at the entrance of the exit table 4 goes ON upon the detection of the wafer W. then, the valve V8 is opened to spout air through the gas spouting pores 61 and the valve V9 is opened to discharge the air through the suction pores 64 to create air flows flowing toward the center of the exit table 4 in the positioning gas flow grooves 63.

After the wafer W has been centered on the exit table 4, the wafer detector 71 of the exit table 4 goes OFF and the valve V7 is closed to stop spouting air through the gas spouting pores 22 and 53 of the seventh passage section S7. The wafer W tends to move downstream by inertia after the spouting of air through the gas spouting pores 53 of the seventh passage section S7. The wafer W is caused to float in a stationary state at a predetermined position above the exit table 4 by the air spouted through the positioning gas spouting pores 63.

Subsequently, the lifting pins 41 is raised to lift up the wafer W and to support the wafer W thereon and the valves V8 and V9 are closed to stop spouting and discharging air. Then, the lifting pins 41 are lowered to place the wafer W on the exit table 4. The wafer W is transferred from the exit table 4 to a carrying arm, not shown, by the cooperative operations of the lifting pins 41 and the carrying arm and the carrying arm carries the wafer W away from the exit table 4.

If the floating height of the wafer W decreases to the lower height level H1 during the operation for carrying the wafer W due to some troubles in the gas spouting system, the floating height measuring devices 74 detects the wafer W and goes ON. Then, the controller 100 decides that the lifting force acting on the wafer W is excessively low and provides an alarm signal. If the lifting force acting on the wafer W is excessively high and the floating height of the wafer W is increased to the upper height level H2, the floating height measuring device 75 detects the wafer W and goes ON. Then, the controller 100 decides that the lifting force acting on the wafer w is excessively high and provides an alarm signal. As mentioned above, a plurality of floating height measuring devices are arranged at vertical intervals not only to detect the wafer W at floating heights corresponding to the floating height levels H1 and H2, but also to detect the wafer W at floating heights in a predetermined floating height range. If the lifting force acting on the wafer W is lost, the wafer W drops at a position between the floating height measuring device 74 of the passage section and the floating height measuring device 74 of the passage section on the downstream side of the former passage section, and the carrying operation is stopped, the wafer detector 71 of the eighth passage section S8 dos not detect the wafer W after the elapse of the predetermined time since the detection of the wafer W by the wafer detector 71 of the second passage section S2. Then, the controller 100 decides that the wafer W is stopped on the carrying passage and provides an alarm signal.

In this embodiment, the two parallel exhaust grooves 51 are formed in the carrying passage forming plate 2 forming the horizontal carrying passage along which the wafer W is carried, the carrying gas flow grooves 52 are formed in pairs arranged along the carrying passage in the upper surface of the carrying passage forming plate 2 on the right-hand side and the left-hand side of the exhaust grooves 51 so as to approach the exhaust grooves 51 in the carrying direction, the inner ends of the carrying gas flow grooves 52 are joined to the exhaust grooves 51, respectively, and the gas spouting pores 53 are formed in the outer ends of the carrying gas flow grooves 52, respectively. Air spouted through the gas spouting pores 53 exerts lifting force on the wafer W and is caused to flow into the exhaust grooves 51 by pressure gradient in the vicinity of the gas spouting pores 53. Air flowing through the carrying gas flow grooves 52 propels the wafer W to move the wafer W along the carrying passage. Air needs to be spouted vertically upward through the gas spouting pores 53 and hence the gas spouting pores 53 are formed vertically in the carrying passage forming plate 2. Therefore, the carrying passage forming plate 2 does not need to be provided with inclined gas spouting pores through which air is spouted obliquely upward to cause the wafer W to float and to propel the wafer W in the carrying direction and hence the carrying passage forming plate 2 can be made by easy machining work.

The carrying gas flow grooves 52 formed in the right-hand and the left-hand part of the carrying passage are extended toward the center line of the carrying passage. Air flowing through the carrying gas flow grooves 52 exerts force on the wafer W in directions toward the center line of the carrying passage while the wafer W is being moved in the carrying direction. Therefore, the wafer W is prevented from drifting transversely and from deviating from a correct course along the carrying passage with its center held on the center line of the carrying passage.

The carrying passage forming plate 2 is divided longitudinally into the plurality of passage sections, the position of the wafer W on the carrying passage with respect to the carrying direction is measured by the wafer detectors 71, and air is spouted only in the passage sections contributing to carrying the wafer W among the passage sections S1 to S8. Thus the passage sections S1 to S8 spout air sequentially as the wafer W is moved successively through the passage sections S1 to S8 and the passage sections S1 to S8 stop spouting air after the wafer W has moved past the passage sections S1 to S8. Thus the substrate carrying device can operate at a low air consumption rate.

Figure 13:
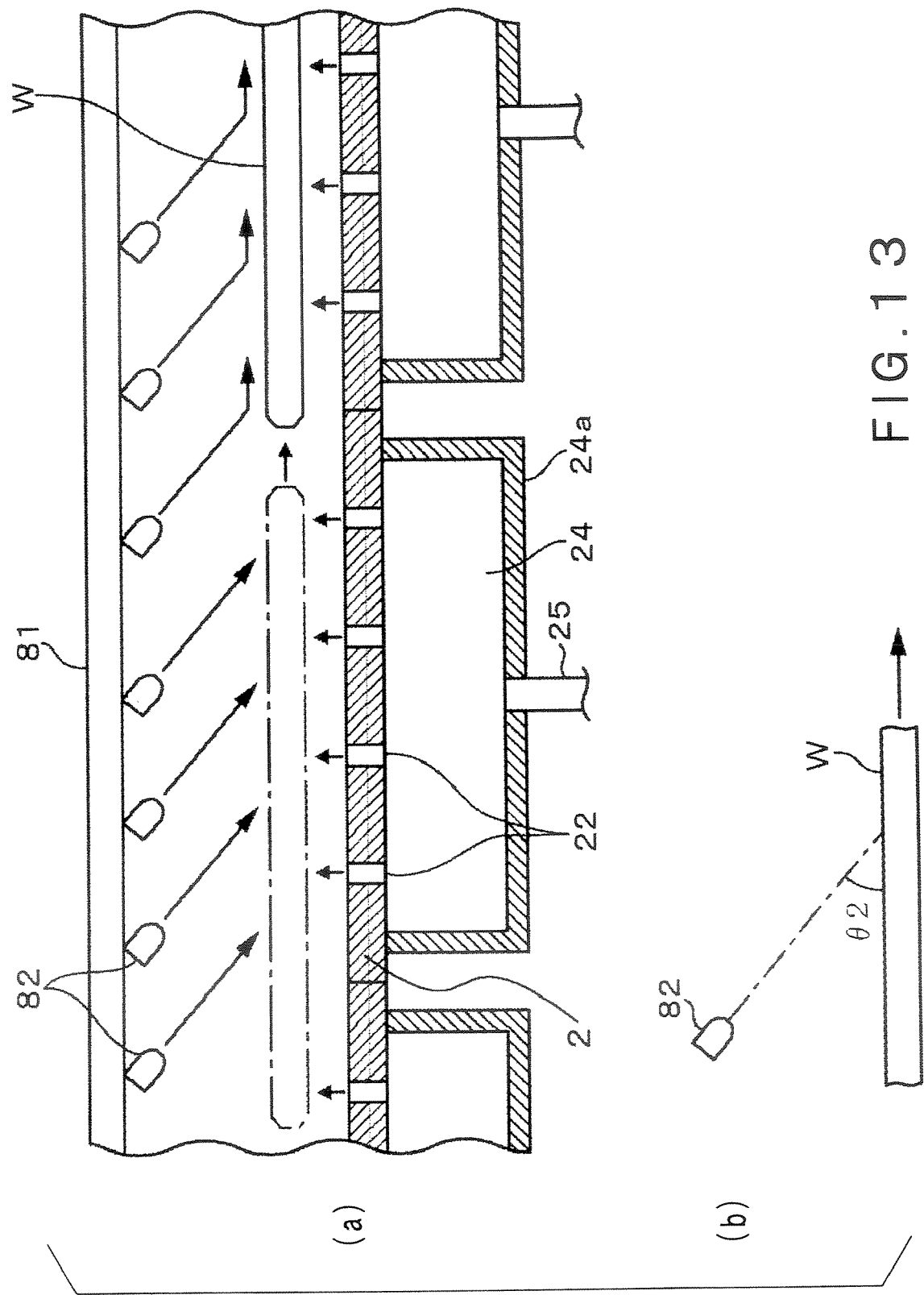
FIG. 13 is a longitudinal sectional view of a substrate carrying device in a second embodiment according to the present invention in a substrate carrying operation.
Figure 14:
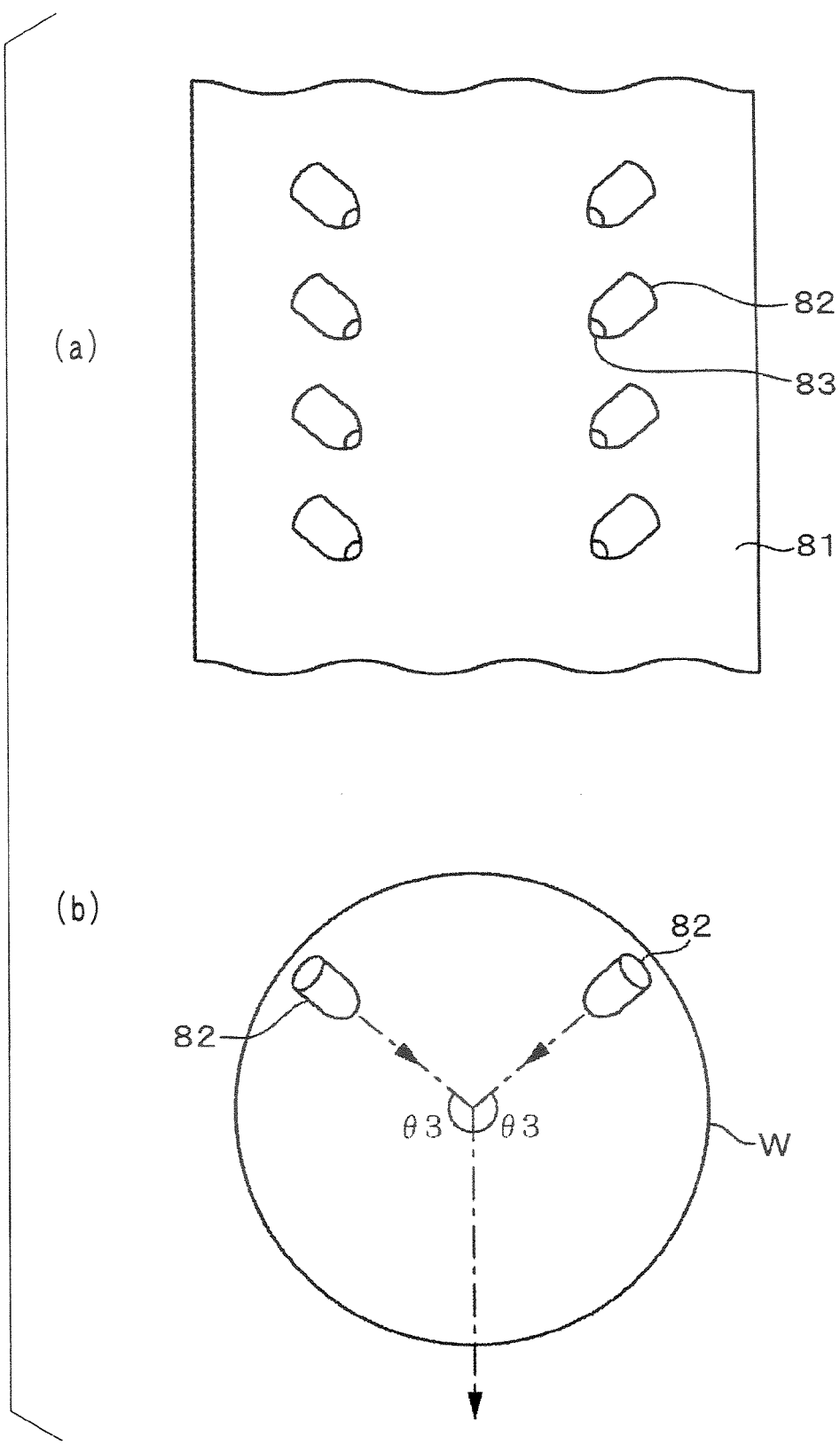
FIG. 14 is a plan view of nozzles included in the substrate carrying device in the second embodiment.

A substrate carrying device in a second embodiment according to the present invention shown in FIG. 13(a) differs from the substrate carrying device in the first embodiment in that the substrate carrying device in the second embodiment is not provided with any grooves corresponding to the exhaust grooves 51 and the carrying gas flow grooves 52 of the first embodiment in its carrying passage, and is provided with a top plate 81 extended above the carrying passage parallel to the carrying passage, and a plurality of nozzles 82 respectively provided with gas spouting pores 83. Air is spouted through the gas spouting pores 83 of the nozzles 82 obliquely downward toward a second end of the carrying passage, i.e., toward an exit table 4. Referring to FIG. 14(a) showing the top plate 81 in a bottom view, the nozzles 82 are arranged in pairs on the top plate 81. The pairs of nozzles 82 are arranged longitudinally at substantially equal intervals. The axes of the gas spouting pores 83 extend toward the center line of the carrying passage.

In the substrate carrying device in the second embodiment shown in FIG. 13(a), a wafer W is caused to float above a carrying passage forming plate 2 only by air spouted through flotation gas spouting pores 22, and air is spouted through the nozzle 82 toward the floating wafer W. Consequently, the wafer W is pushed toward the center line of the carrying passage and is propelled toward the second end of the carrying passage to move the wafer W along the center line of the carrying passage. FIG. 13(b) shows the wafer W in a side elevation. as shown in FIG. 13(b), the angle θ2 between a chain line indicating a direction in which a gas is spouted through the gas spouting pore 83 and aligned with the axis of the gas spouting pore 83, and the surface of the wafer W is, for example, between 15° and 45°. FIG. 14(b) shows the wafer W in a top view. As shown in FIG. 14(b), the angle θ3 between the axis of the nozzle 82 and a moving direction in which the wafer W is moved, namely, a direction toward the exit table 4, is, for example, between 120° and 180°.

In the substrate carrying device in the second embodiment, air is spouted toward the floating wafer W through the nozzles 82 disposed above the carrying passage at an angle of depression to the surface of the wafer W to propel the wafer W. Since there are only a few restrictions on the shape of the nozzles and space for installing the nozzles and hence the substrate carrying device can be easily manufactured.

In the substrate carrying device shown in FIG. 13(a), the carrying passage forming plate 2 may be divided into a plurality of passage sections, namely, passage sections S1 to S8, the position of the wafer W on the carrying passage with respect to the carrying direction may be measured by wafer detectors 71, operations for spouting air through the nozzles 82 and the flotation gas spouting pores 22 and stopping spouting air through nozzles 82 and the flotation gas spouting pores 22 corresponding to the passage sections S1 to S8 may be controlled on the basis of the measured position of the wafer W, and an alarm signal may be provided when a measured floating height of the wafer W is not acceptable.

A semiconductor device fabricating system including the substrate carrying device of the present invention will be described with reference to FIGS. 15 to 18. The semiconductor device fabricating system is a coating and developing system for coating a wafer W with a resist film and developing a latent image formed in the resist film by exposure with a developer.

Figure 15:
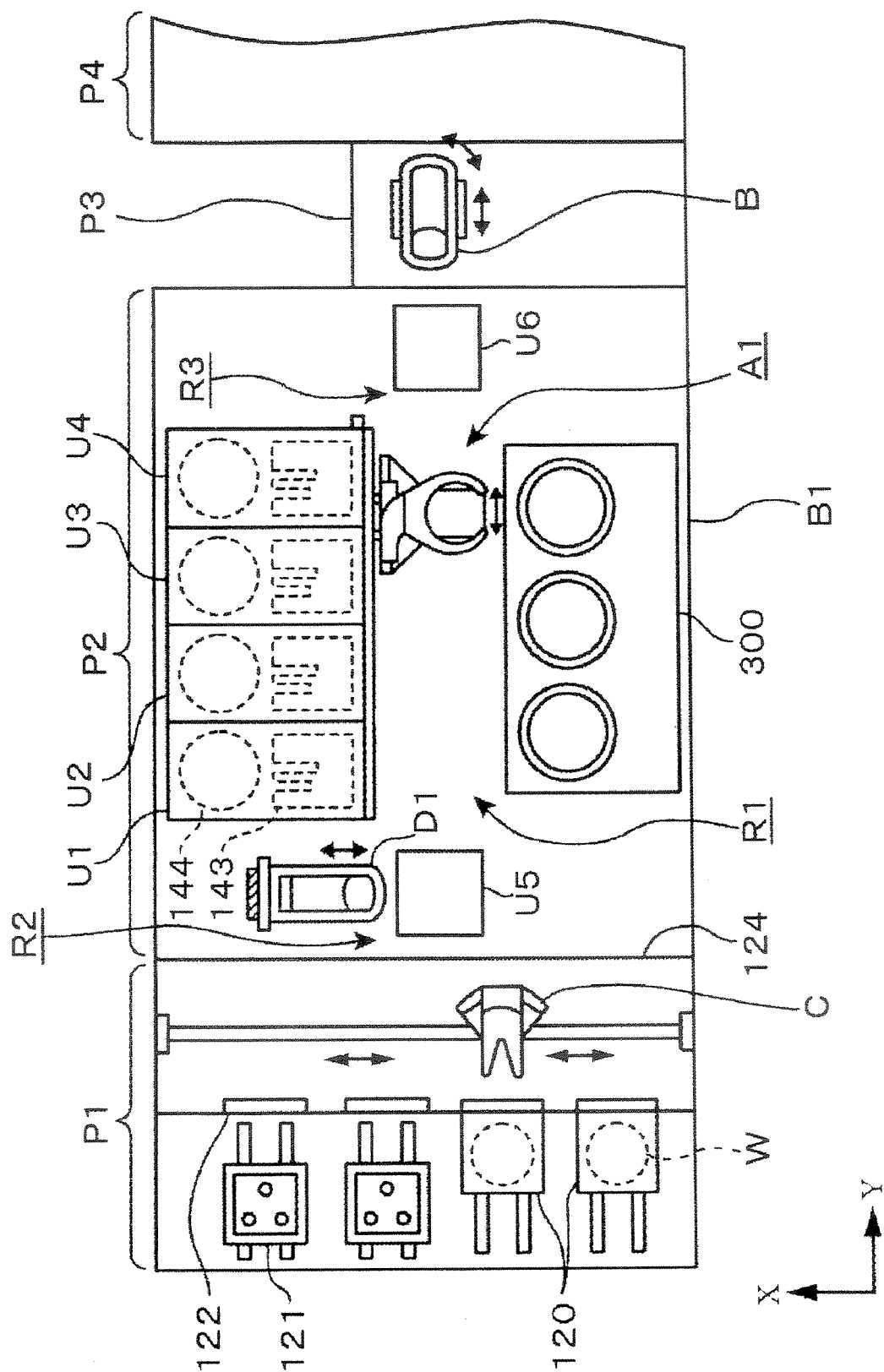
FIG. 15 is a plan view of a coating and developing system including a substrate carrying device according to the present invention.
Figure 16:
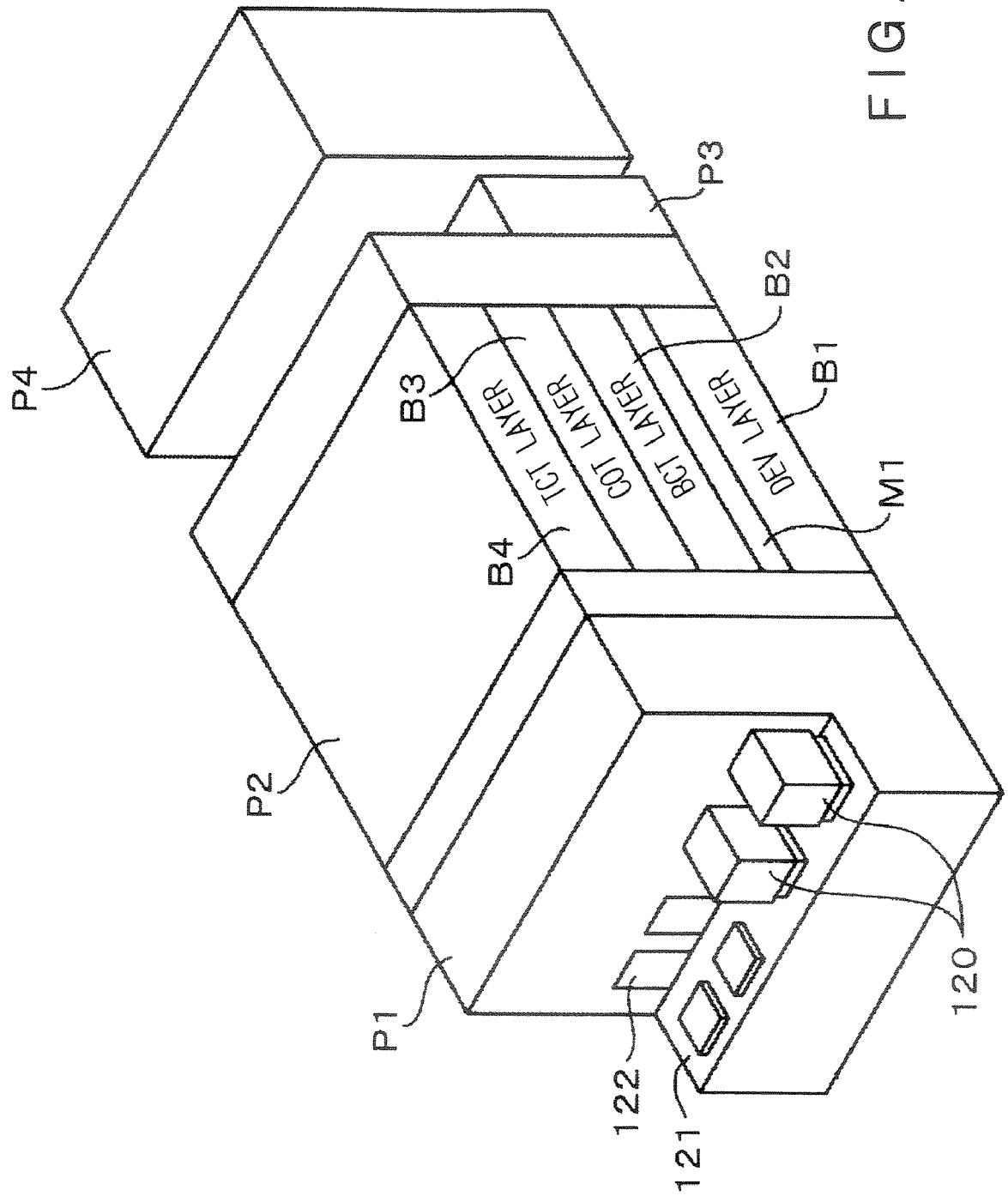
FIG. 16 is a perspective view of the coating and developing system shown in FIG. 15.
Figure 17:
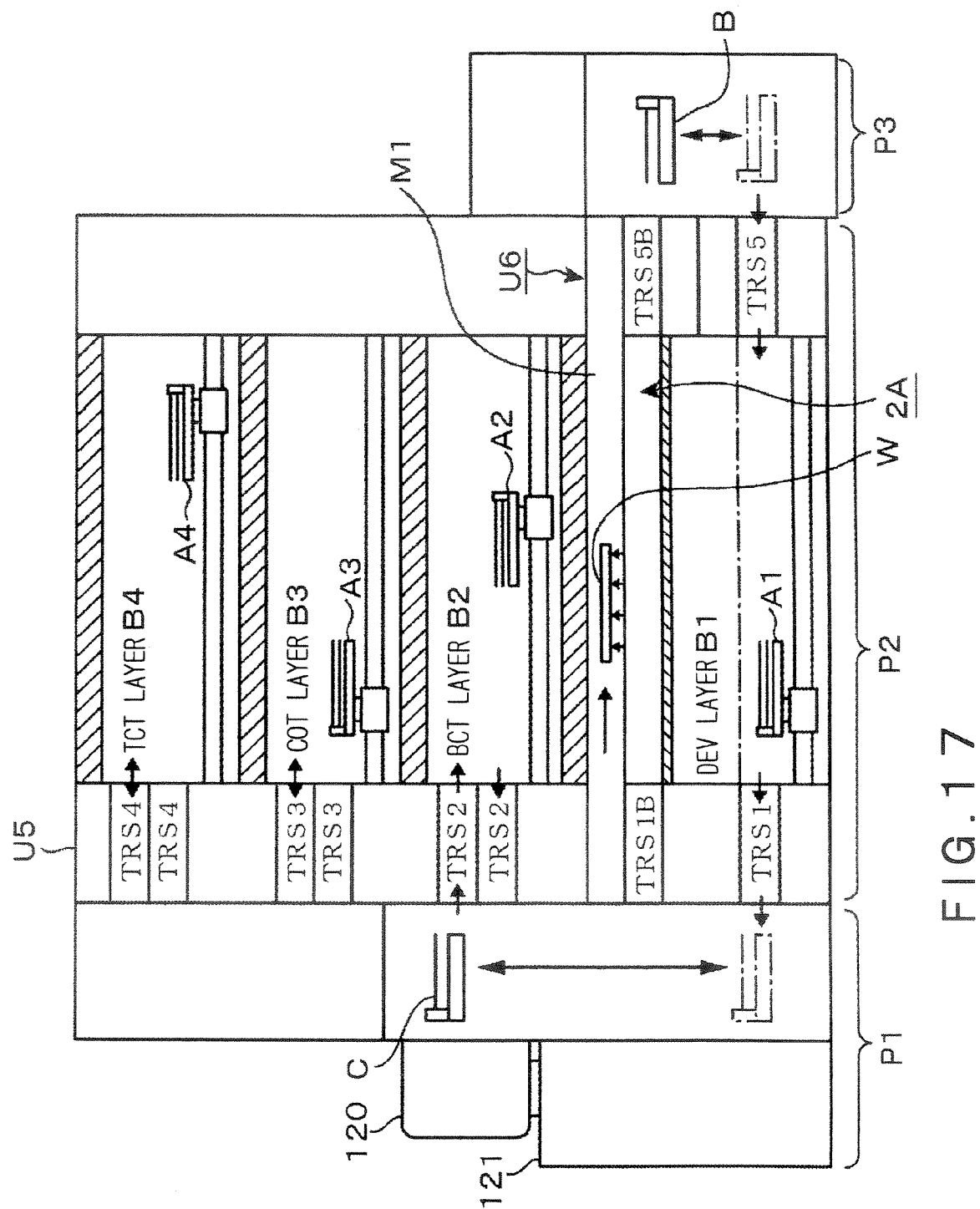
FIG. 17 is longitudinal sectional view of the coating and developing system shown in FIG. 15.
Figure 18:
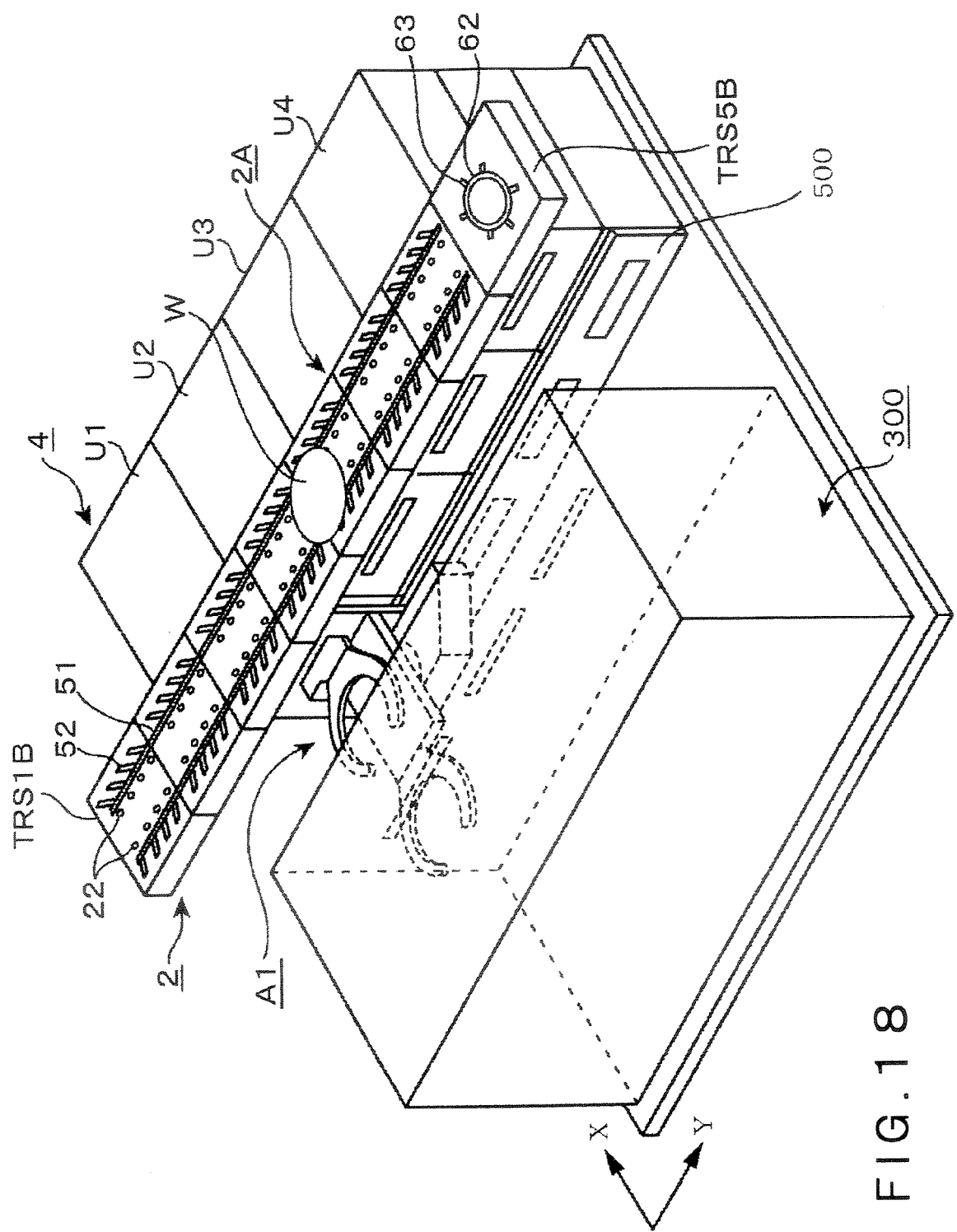
FIG. 18 is a perspective view of a coating unit, a shelf unit, a main arm and an exhaust unit include in a DEV layer in the coating and developing system shown in FIG. 15.
Figure 19:
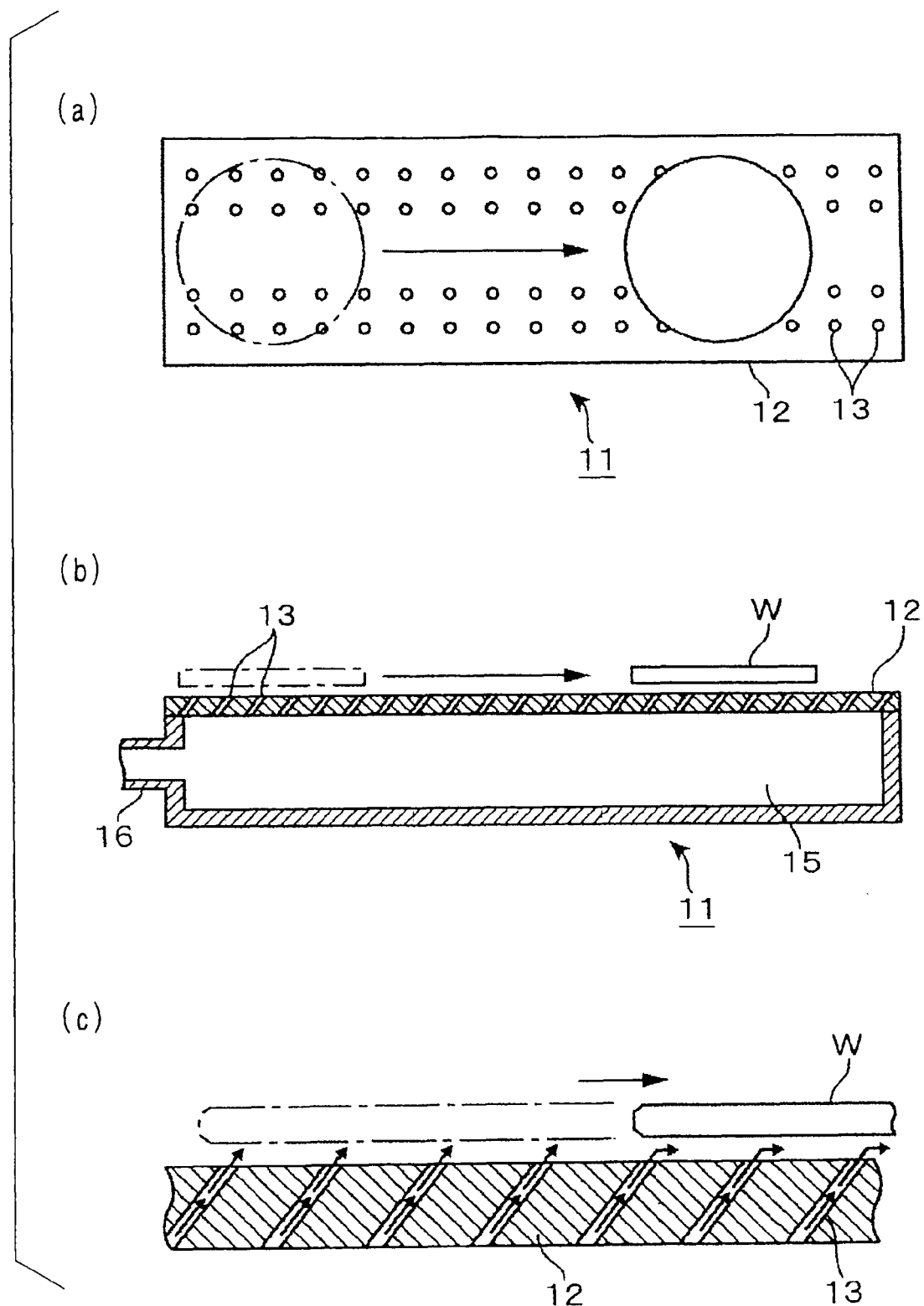
FIG. 19 is a view showing a known substrate carrying device.

FIG. 15 is plan view of the coating and developing system, FIG. 16 is a perspective view of the coating and developing system shown in FIG. 15 and FIG. 17 is longitudinal sectional view of the coating and developing system shown in FIG. 15. The coating and developing system is installed in a cleanroom filled up with an atmospheric atmosphere. The coating and developing system includes a carrier handling block P1 for receiving and sending out a carrier 120 containing thirteen wafers W, namely, substrates, a processing block P2 including four blocks B1 to B4 and a carrying block M1 stacked up in layers, an interface block P3 and an exposure system P4.

The carrier handling block P1 includes a carrier support table 121 capable of supporting a plurality of carriers 120 thereon, a wall disposed behind the carrier support table 121 and provided with closable openings 122, and a transfer arm C for taking out the wafers W from the carrier 120 through the closable opening 122. The transfer arm C can move longitudinally, can move vertically and can turn about a vertical axis to transfer the wafer W to and to receive the wafer W from each of transfer stages TRS1 and TRS2 included in the blocks B1 and B2, and can move along the arrangement of the carriers 120.

The processing block P2 surrounded by a box 124 is disposed behind and joined to the carrier handling block P1. The processing block P2 includes the first block B1 (DEV layer), the carrying block M1, the second block B2 (BCT layer) for forming a lower antireflection film under a resist film, the third block B3 (COT layer) for carrying out a liquid resist application process, and the fourth block B4 (TCT layer) for forming an upper antireflection film on a resist film stacked up in that order. The blocks B1 to B4 and the carrying block M1 are extended between the carrier handling block P1 and the interface block P3. The DEV layer B1 is a developing block, and the BCT layer B2, the COT layer B3 and the TCT layer B4 are coating blocks for forming a film of a resist, namely, a photosensitive material. The adjacent blocks are separated by partition plates (base members).

The configuration of the first block B1 to the fourth block b4 will be described. In this coating and developing system, the blocks B1 to B4 have many common parts and the blocks B1 to B4 are similar in the layout of component parts. Therefore, the DEV layer B1 will be described by way of example with reference to FIG. 15. A carrying passage R1 along which a wafer W is carried is extended longitudinally, i.e., in a direction along the length of the DEV layer B1 indicated by the arrow Y, in a middle part of the DEV layer B1 to interconnect the carrier handling block P1 and the interface block P3.

A developing unit 300, namely, a wet-processing unit, is extended along the carrying passage R1 on the right-hand side, as viewed from the carrier handling block P1, of the carrying passage R1. The developing unit 300 is provided with a plurality of developing devices for carrying out a developing process using a developer. Four shelf units U1, U2, U3 and U4, and an exhaust unit 500 are arranged in that order along the carrying passage R1 on the left-hand side, as viewed from the side of the carrier handling unit P1. Each of the shelf units U1 to U4 has thermal processing units for heating and cooling stacked in layers. The developing unit 300, and the shelf units U1 to U4 are disposed on the opposite sides, respectively, of the carrying passage R1. Each of the shelf units U1 to U4 has a thermal processing unit for the pretreatment of the wafer W before the wafer W is processed by the developing unit 300, and a thermal processing unit for the post treatment of the wafer W after the wafer W has been processed by the developing unit 300. Those thermal processing units are stacked in two layers.

The thermal processing units includes heating units for processing the wafer W processed by an exposure process by a heating process, heating units for processing the wafer W by a heating process to dry the wafer W processed by a developing process, and cooling units for cooling the wafer W processed by the heating unit to adjust the temperature of the wafer W to a predetermined temperature. In this embodiment, each of the shelf units U1, U2 and U3 has two heating units stacked in two layers, and the shelf unit U4 has two cooling units stacked in two layers.

The carrying block M1 is provided with a substrate carrying device 2A according to the present invention, namely, a direct carrying means for carrying the wafer W from the carrier handling block P1 directly to the interface block P3.

The substrate carrying device 2A is the foregoing air flotation type substrate carrying device built, for example, in construction similar to that shown in FIG. 1. The substrate carrying device 2A carries the wafer W from a transfer stage TRS1B corresponding to the entrance table 3 for receiving the wafer W to a transfer stage TRS5B corresponding to the exit table 4 from which the wafer W is sent out.

Areas in the carrying passage R1 and the carrying block M1 contiguous with the carrier handling block P1 are a first transfer area R2. A shelf unit U5 is installed in the first transfer area R2 as shown in FIGS. 15 and 17. The main arm A1, the substrate carrying device 2A and the transfer arm C can reach the shelf unit U5. A transfer arm D1, namely, a vertical carrying means, transfers the wafer W to and receives the wafer W from the shelf unit U5.

In the block B1, the transfer stage TRS1B is disposed above the transfer stage TRS1. The transfer arms C and D1 can reach the transfer stage TRS1B. The main arm A1, the transfer arm C and the transfer arm D1 can reach the transfer stage TRS1. Each of the transfer stages TRS1 and TRS1B has a rectangular box, a stage provided with a mechanism for adjusting the temperature of the wafer W placed on the stage to a predetermined temperature, and lifting pins capable of being projected from and or being retracted into the stage. Each of the arms advances into the box through an opening formed in a wall of the box facing the arms to receive the wafer W lifted up by the lifting pins from the lifting pins or to transfer the wafer W to the lifting pins to place the wafer W on the stage.

As shown in FIG. 17, the blocks B2, B3 and B4 are provided with two transfer stages TRS2, two transfer stages TRS3 and two transfer stages TRS4, respectively. All those transfer stages have the forgoing construction. The transfer stages TRS2 to TRS4 can transfer the wafer W to and receive the wafer W from main arms A2, A3 and A4 included in the layers B2 to B4, respectively, and can transfer the wafer W to and receive the wafer W from the transfer arm D1. The transfer stages TRS2 can also receive the wafer W from and transfer the wafer W to the transfer arm C. The number of the transfer stages TRS is not limited; each block may be provided with two or more transfer stages.

Areas in the carrying passage R1 and the carrying block M1 of the DEV layer B1 contiguous with the interface block P3 are a second transfer area R3. A shelf unit U6 is installed in the second transfer area R3 as shown in FIG. 15. The shelf unit U6 is provided with a transfer stage TRS5 and a transfer stage TRS5B disposed above the transfer stage TRS5 as shown in FIG. 17. The wafer W can be transferred between the transfer stage TRS5B and the interface arm B. The wafer W can be transferred between the transfer stage TRS5 and the main arm A1 and between the transfer arm TRS5 and the interface arm B. The transfer stages TRS5 and TRS5B are the same in construction as the transfer stage TRS1B; the transfer stages TRS5 and TRS5B have a cooling function to accomplish the temperature management of the wafer W transferred thereto.

The exposure system P4 is connected to the shelf unit U6 of the processing block P2 by the interface block P3. The interface block P3 is provided with the interface arm B. The interface arm B transfers the wafer W between the shelf unit U6 of the processing block P2 and the exposure system P4. The interface arm B includes, for example, a base, not shown, and an arm, not shown, capable of moving on the base. A central part of the wafer W is seated on the arm. The base is supported on a lifting member by a rotary mechanism so as to be turnable about a vertical axis. The base is moved vertically along a vertical rail. Thus the arm can be advanced and retracted, can be moved vertically and can be turned about a vertical axis.

The transfer arm D1 is similar in construction to the interface arm B, except that the transfer arm D1 cannot be turned about a vertical axis.

The interface arm B is a wafer carrying means for carrying the wafer W between the processing block P2 and the exposure system P4. In this embodiment, the interface arm B receives the wafer W from the transfer stage TRS5B of the block B1 and carries the same into the exposure system P4, and receives the wafer W from the exposure system P4 and transfers the same to the transfer stage TRS5.

The operation of the coating and developing system will be described in terms of the flow of the wafer W during operations for forming antireflection films over and under a resist film, respectively. A carrier 120 is delivered to the carrier handling block P1. The transfer arm C takes out a wafer W from the carrier 120. The wafer W is transferred from the transfer arm C through the transfer stage TRS2 of the shelf unit U5 to the main arm A2 of the BCT layer B2. In the BCT layer B2, the main arm A2 carries the wafer sequentially to the cooling unit, the antireflection film forming unit, not shown and corresponding to the developing unit 300, the heating unit and the transfer stage TRS2 of the shelf unit U5 to form a lower antireflection film.

Then, the transfer arm D1 carries the wafer W from the transfer stage TRS2 to the transfer stage TRS3 of the COT layer B3 and transfers the same to the main arm A3 of the COT layer B3. In the COT layer B3, the main arm A3 carries the wafer W sequentially to the cooling unit and the resist application unit, not shown and corresponding to the developing unit 300, and the heating unit to form a resist film on the lower antireflection film. Then, the wafer W is carried to an edge exposure unit to process the wafer W by an edge exposure process and the wafer W is carried to the transfer stage TRS3 of the shelf unit U5.

Subsequently, the transfer arm D1 carries the wafer W from the transfer stage TRS3 to the transfer stage TRS4 of the TCT layer B4 and transfers the same to the main arm A4 of the TCT layer B4. In the TCT layer B4, the main arm A4 carries the wafer W sequentially to the cooling unit, the second antireflection film forming unit, not shown and corresponding to the developing unit 300, and the heating unit to form an upper antireflection film on the resist film. Then, the wafer W is carried to the transfer stage TRS4 of the shelf unit U5.

Then, the transfer arm D1 carries the wafer W from the transfer stage TRS4 to the transfer stage TRS1B. Then the wafer W is caused to float, is carried to the interface block P3 and is transferred to the transfer stage TRS5B by the substrate carrying device of the present invention. The transfer stage TRS5B may be provided with a cooling plate for adjusting the temperature of the wafer W to a temperature suitable for the exposure process. The interface arm B carries the wafer W from the transfer stage TRS5B into the exposure system P4. Then, the wafer W is subjected to a predetermined exposure process.

The interface arm B carries the wafer W processed by the exposure process to the transfer stage TRS5 of the shelf unit U6 The main arm A1 of the DEV layer B1 carries the wafer W from the transfer stage TRS5 sequentially to the heating unit, the cooling unit, the developing unit 300, the heating unit and the cooling unit of the shelf units U1 to U4 to process the wafer W by a predetermined developing process. The wafer W processed by the developing process is carried to the transfer stage TRS1 of the shelf unit U5. Then the transfer arm C returns the wafer W into the carrier 120 held in the carrier handling block P1.

What is claimed is:

1. A substrate carrying device comprising:
    a carrying passage forming member forming a carrying passage extending in a substrate carrying direction;
    flotation gas spouting pores formed in the carrying passage forming member and arranged along the carrying passage to spout a flotation gas for causing a substrate to float;
    carrying gas spouting pores formed in the carrying passage forming member to create gas flows for carrying the floating substrate along the carrying passage;
    gas supply control means for controlling starting and stopping supplying the gas to groups of the gas spouting pores assigned to passage sections defined by longitudinally dividing the carrying passage such that the groups of the gas spouting pores start spouting the gas and stop spouting the gas independently;
    position measuring means for measuring the position of the substrate on the carrying passage; and
    a control unit for controlling opening and closing operations of the gas supply control means for controlling starting and stopping supplying the gas to the groups of the spouting pores on the basis of measured data provided by the position measuring means.

2. The substrate carrying device according to claim 1, wherein the position measuring means are substrate detectors disposed in the passage sections, respectively, to detect a substrate.

3. The substrate carrying device according to claim 1 further comprising:
    floating height measuring means for measuring a floating height of the substrate from the carrying passage; and
    a decision means for deciding whether or not the substrate is at a predetermined floating height on the basis of a floating height measured by the floating height measuring means.

* * * * *